United States Patent [19]

Yang et al.

[11] Patent Number: 4,756,924

[45] Date of Patent: * Jul. 12, 1988

[54] METHOD FOR THE MICROWAVE FABRICATION OF BORON DOPED SEMICONDUCTOR MATERIALS

[75] Inventors: Chi C. Yang, Troy; Ralph Mohr, Detroit; Stephen Hudgens, Southfield; Annette Johncock, Walled Lake; Prem Nath, Rochester, all of Mich.

[73] Assignee: Energy Conversion Devices, Inc., Troy, Mich.

[*] Notice: The portion of the term of this patent subsequent to Feb. 11, 2003 has been disclaimed.

[21] Appl. No.: 850,190

[22] Filed: Apr. 10, 1986

Related U.S. Application Data

[62] Division of Ser. No. 668,435, Nov. 5, 1984, Pat. No. 4,624,862.

[51] Int. Cl.[4] .................... B05D 3/06; B05D 3/02
[52] U.S. Cl. ...................... 427/39; 427/45.1
[58] Field of Search ...................... 427/45.1, 39

[56] References Cited

U.S. PATENT DOCUMENTS

| | | | |
|---|---|---|---|
| 4,361,638 | 11/1982 | Higashi | 427/39 |
| 4,409,424 | 10/1983 | Devaud | 357/30 |
| 4,521,447 | 6/1985 | Ovshinsky | 427/45.1 |
| 4,569,697 | 2/1986 | Tsu | 427/86 |
| 4,600,801 | 7/1986 | Guha | 427/39 |
| 4,619,729 | 10/1986 | Johncock | 427/39 |

*Primary Examiner*—Shrive P. Beck
*Assistant Examiner*—Vi Duong Dang
*Attorney, Agent, or Firm*—Marvin S. Siskind; Richard M. Goldman

[57] ABSTRACT

A microwave glow discharge method for the deposition of p-doped semiconductor alloy material, which material is characterized by mono-atomic and tetrahedral incorporation of boron species into the semiconductor host matrix, thereby providing a p-doped semiconductor alloy material characterized by reduced bulk strain, reduced nucleation of undesirable morphological growth, improved adhesion to a substrate and reduced peeling and cracking.

2 Claims, 4 Drawing Sheets

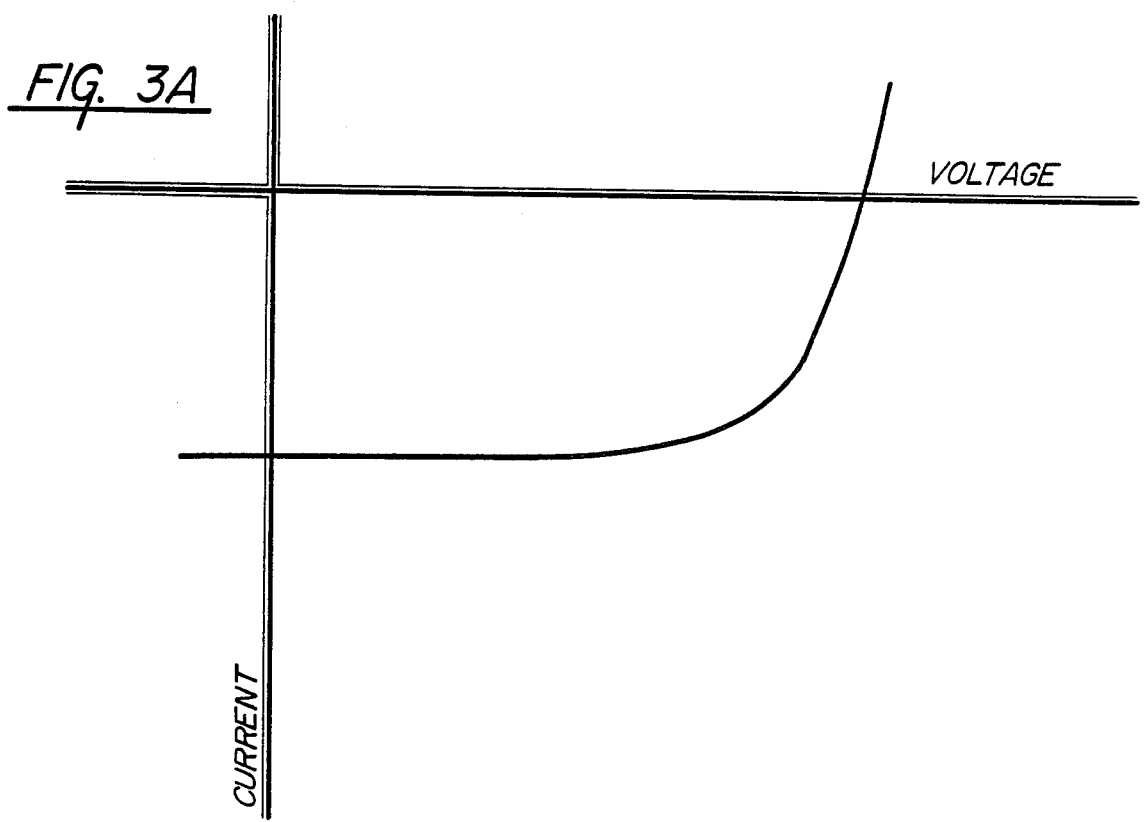
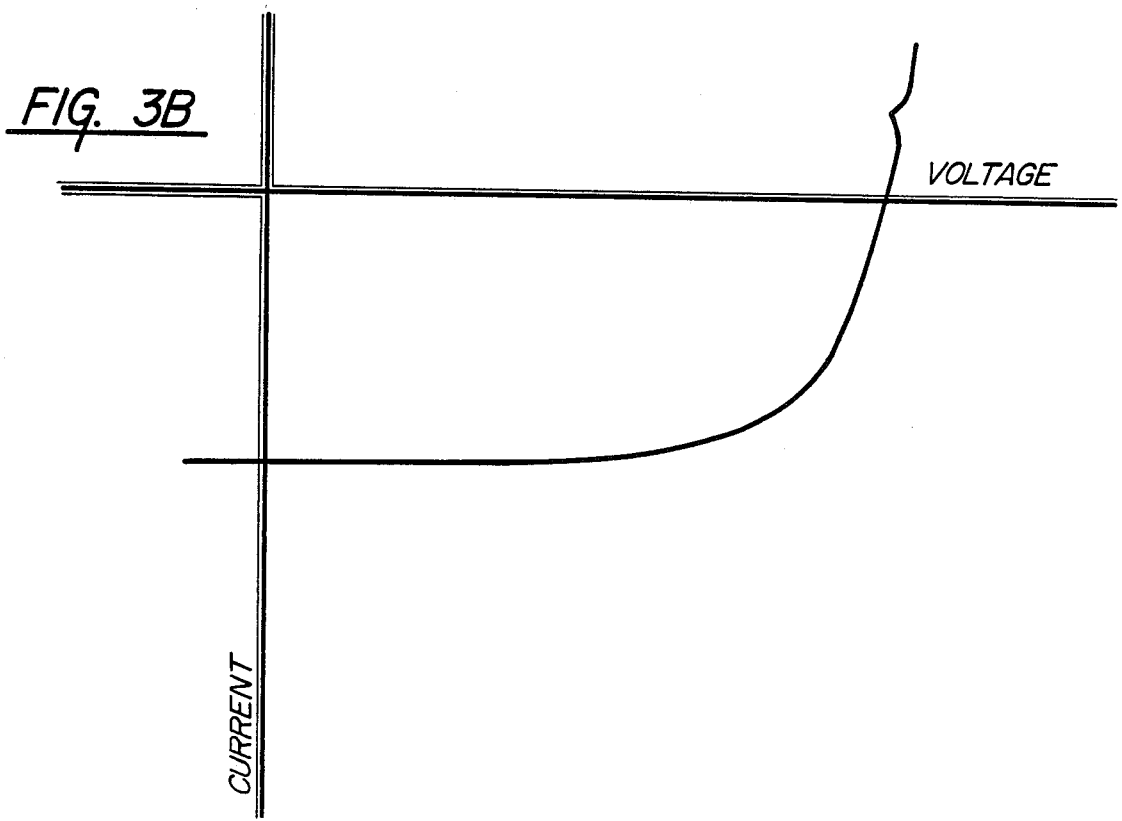

METHOD FOR THE MICROWAVE FABRICATION OF BORON DOPED SEMICONDUCTOR MATERIALS

This is a divisional of application Ser. No. 668,436 filed Nov. 5, 1984, now U.S. Pat. No. 4,624,862.

FIELD OF THE INVENTION

This invention relates generally to thin film semiconductor alloy layers and more particularly to photoresponsive devices fabricated from such thin film semiconductor alloy layers. Specifically, the semiconductor alloy material is fabricated so as to substantially monoatomically incorporate boron species in the host matrix of the p-doped and intrinsic layers. The invention further relates to processes by which said thin film alloy layers are fabricated. By the process of the present invention, both boron and fluorine are more favorably incorporated into the host matrix of the semiconductor alloy in an electronically and chemically favorable manner while simultaneously (1) substantially controlling the amount of hydrogen incorporated into the matrix, (2) substantially eliminating undesirable morphology and growth and (3) substantially relaxing strain. A novel method of and apparatus for the roll-to-roll production of electronic devices incorporating said improved thin film semiconductor alloy layers is also described.

BACKGROUND OF THE INVENTION

Glow discharge deposited hydrogenated and fluorinated amorphous semiconductor alloy films have gained commercial acceptance as the material from which to fabricate low cost and efficient photovoltaic, semiconductor and electronic devices. Since Ovshinsky, et al first reported the development of efficient photoresponsive devices from amorphous silicon alloys in 1978, a great deal of effort has been expended worldwide by research teams in analyzing the properties of amorphous semiconductor alloy, particularly said amorphous silicon alloys, so as to optimize the types and percentages of constituent elements introduced into the glow discharge plasma, as well as the fabrication parameters utilized in the production of same. Up to the date of the instant invention, diborane was the precursor process gas utilized in research as well as commercial applications in order to substitutionally p-dope the semiconductor alloy host matrix for forming the p-doped semiconductor alloy layer of various photoresponsive devices. However, the p-doped semiconductor alloy layer is generally considered to be the poorest layer of a p-i-n type photoresponsive device. The p-doped layer is considered to be the poorest because of the fact that more tail states exist adjacent the valence band than adjacent the conduction band of an amorphous silicon alloy material. Consequently, the Fermi level of the p-doped layer cannot be shifted as close to the valence band thereof as the Fermi level of the n-doped layer can be shifted to the conduction band.

Due to the fact that (1) very little boron is substitutionally introduced into the host matrix of the semiconductor alloy material (vis-a-vis, the amount of boron alloyed into said host matrix) and (2) a very large number of tail states exist adjacent the valence band of amorphous silicon, it has not heretofore been possible to move the Fermi level of said p-doped amorphous silicon alloy material closer than approximately 0.3 electron volts (eV) from the valence band. This is in contrast to the n-doped material in which the Fermi level can be moved almost all the way up to the conduction band. Obviously, the closer to the respective band edges the Fermi level can be moved and better the degree of substitional doping of the semiconductor alloy, (1) the better the electrical conductivity of that semiconductor alloy material becomes and (2) the higher the strength of the electric field induced across the intrinsic semiconductor alloy material by the doped semiconductor alloy materials becomes. Based upon the foregoing discussion, it should be evident that (1) the p-doped amorphous semiconductor alloy layer indeed represents a weak link in the p-i-n or p-n type photovoltaic devices, and (2) any improvement in the p-doped semiconductor alloy layer which would increase the amount of substitutional doping thereof without significantly increasing the density of defect states in the band gap thereof would represent a clear step forward in the art.

Recently, considerable effort has been expended to develop systems and processes for depositing amorphous semiconductor alloy materials which encompass relatively large areas, and which can be doped so as to form p-type and n-type semiconductor alloy layers for the production of thin film p-n type and p-i-n type photovoltaic devices substantially operatively equivalent to their crystalline counterparts. It is to be noted that the term "amorphous", as used herein, includes all materials or alloys which have no long range order, although they may have short or intermediate range order or even contain, at times, crystalline inclusions. Of course, the photoresponsive devices so fabricated from doped and undoped amorphous semiconductor alloy layers were limited in the photoconversion efficiency thereof by, inter alia, the poor quality p-doped semiconductor alloy material. It should be noted that the morphology and growth of subsequently deposited thin film layers are also adversely affected by the poor quality of the p-doped layer and the problems of undesirable morphology and growth discussed hereinafter. Consequently, the deposition of a poor p-doped layer causes morphologically poor intrinsic and n-doped semiconductor alloy layers to be grown.

It is now possible to prepare amorphous silicon alloys by glow discharge or vacuum deposition techniques, said alloys possessing "acceptable" concentrations of localized defect states in the energy gaps thereof. While the concentrations of defect states have been termed "acceptable", the densities thereof remain too high to produce photovoltaic cells having photoconversion efficiencies in the 15% and above range. In order to better appreciate the full impact of the present invention in providing a more substitutionally doped p-type semiconductor alloy, a brief historical description of the mechanisms involved in the deposition of amorphous semiconductor alloy materials is presented.

The most commonly employed amorphous semiconductors, i.e. amorphous silicon and germanium, are normally four-fold coordinated and normally include microvoids and dangling bonds which are believed to produce said high density of localized states in the band gaps thereof. In the glow discharge deposition of amorphous silicon films, a silicon containing process gas such as silane flows into a reaction chamber for decomposition by an R.F. plasma and deposition onto a substrate. It is the elements present in the process gases, the chemical combinations of those elements following disassociation by the plasma, as well as the manner in which those elements are bonded into the host matrix of the semiconductor material that determine the density of defect states in the band gap of the deposited semiconductor alloy film; also important to the quality of the semiconductor alloy film is whether the dopant element and species introduced into the plasma are incorporated substitutionally or alloyed with the semiconductor material.

More particularly, it is now known that the hydrogen from the silane precursor gas which combines at optimum temperature and pressure conditions with many of the dangling bonds of the silicon during the glow discharge deposition process so as to substantially decrease the density of the localized states in the energy gap toward the end of making the deposited amorphous semiconductor alloy material approximate more nearly the corresponding crystalline semiconductor alloy material. However, the incorporation of hydrogen not only has limitations based upon the fixed ratio of hydrogen to silicon in the silane gas, but, perhaps most importantly, various Si-H bonding configurations operate to introduce new antibonding states into the semiconductor alloy material which can deleteriously affect the electrical and optical properties of said material. Therefore, there are certain unacceptable material properties which arise when hydrogen is utilized to reduce the density of localized states in these materials, which properties are particularly harmful in terms of the effective p as well as n doping thereof. The resulting unacceptable density of states of the hydrogenated silane-deposited semiconductor alloy materials leads to a narrow depletion width, which in turn limits the efficiencies of solar cells and other devices, the operation of which depends on the drift length of charge carriers through the layers of semiconductor alloy material.

Thus it has been attempted to alter the amorphous silicon, deposited from an atmosphere of silane by prior art glow discharge deposition processes, by the addition of hydrogen from the silane precursor gas in an effort to make said silicon more closely resemble crystalline silicon. To that end, the silicon is doped in a manner similar to the manner in which crystalline silicon is doped. However, such glow discharge deposited amorphous silicon has characteristics which, in all important respects, are inferior to those of doped crystalline silicon and therefore cannot be used successfully in place of doped crystalline silicon.

While the amorphous semiconductor alloy materials have many bonding options, the bonding of the elements of the amorphous semiconductor alloy material into the solid amorphous matrix is primarily accomplished by covalent bonding, which bonding is responsible for the strong bonds which allow the amorphous material to substantially maintain its integrity and energy gap. As used herein, the normal structural bonding, which characterizes conventionally prepared amorphous materials, is the condition where each atom forms the optimal number of bonds, such as covalent bonds, primarily responsible for the cohesive energy of the amorphous solid. The energy gap of a semiconductor alloy is basically determined by the solid amorphous semiconductor alloy materials forming the amorphous host matrix and the structural configurations present in that matrix. In purely substitutional doping, a dopant atom (such as boron for p-doping) takes the place of a semiconductor atom (such as silicon) in the host matrix in such a manner that (1) the bonding remains covalent (tetrahedrally coordinated), (2) the silicon to silicon and silicon to boron bonds are not strained, and (3) the concentration of higher order boron hydrides is minimized.

It is the situation which arises when other, weaker, bonds (vis-a-vis, the existing silicon to silicon bonds) are formed upon the introduction of the p-dopant atoms that gives rise to a solid amorphous semiconductor alloy material which has a wide spectrum of localized states in the energy gap, including bonding and nonbonding states, which states are herein referred to as deviant or defect electronic configurations and which have an effect upon the Fermi level, the electrical conductivity and the electrical activation energy of the semiconductor alloy material. Such deviant electronic configurations can include substitutional impurities and vacancies, intersitials, dislocations, and so forth, which can occur principally in crystalline solids because of periodic restraints therein. In solid amorphous alloy materials, three-dimensional orbital relationships can occur which are generally prohibited in crystalline materials by reason of the periodic lattice constraints in the latter. Other deviant electronic configurations, particularly in the amorphous semiconductor alloy materials described in the instant application, can include microvoids and dangling bonds, dangling bond and nearest neighbor interactions, lone pairs, lone-pair/lone-pair interactions, lone pair and nearest neighbor interactions, valence alternation pairs, dative or coordinate bonds, charge compensation, polyvalency, lone-pair compensation, hybridization, three-center bonding, pi-bonding, and others, all of which operate toward pinning and affecting the Fermi level in the energy gap of the semiconductor alloy materials and control the electrical conductivity mechanism within said materials.

The localized states present in the energy gap, the degree of substitutional doping as well as the growth and morphology which occurs, and the concentration of boron polymers and oligomers are, inter alia, related to the structural configuration of the host matrix of the amorphous semiconductor alloy, to the nearest neighbor relationship of the elements in that matrix, to the aforementioned deviant electronic configurations, and to the electrically active centers in the amorphous semiconductor alloy matrix. The electrical activation energy $E_a$ for free carrier conduction is usually the energy difference between the Fermi level and the nearest band edge (valence band or conduction band) and in an ideal intrinsic semiconductor material its value is of the order of one-half the energy gap.

As disclosed in U.S. Pat. No. 4,226,898 of Ovshinsky, et al, which patent is assigned to the assignee of the instant invention and the disclosure of which is incorporated by reference, fluorine introduced into the amorphous silicon alloy semiconductor layers operates to substantially reduce the density of the localized defect states in the energy gap thereof and facilitates the addition of other alloying materials, such as germanium. As a result of introducing fluorine into the host matrix of the amorphous semiconductor alloy, the film so produced can have a number of favorable attributes similar to those of crystalline materials. A fluorinated amorphous semiconductor alloy can thereby provide high photoconductivity, increased charge carrier mobility, increased diffusion length of charge carriers, low dark intrinsic electrical conductivity, and, where desired, such alloys can be modified to help shift the Fermi level to provide substantially n- or p-type extrinsic electrical conductivity. Thus, fluorinated amorphous semiconductor alloy materials can act like crystalline materials and be useful in devices, such as, solar cells and current controlling devices including diodes, transistors and the like.

It is now possible to deposit a good n-type conductivity amorphous silicon alloy film. In order to similarly fashion a good p-type conductivity amorphous silicon alloy film, it is necessary to substantially substitutionally and monoatomically incorporate the boron or other p-dopant atoms into the host matrix of the semiconductor alloy along with the semiconductor, fluorine and hydrogen atoms. However, it is difficult to tetrahedrally introduce boron atoms into the semiconductor alloy matrix. Moreover, boron introduced into the matrix through the glow discharge of a diborane precursor gas has a tendency to form chains of higher order boron hydrides which are normally not accepted in said matrix without either breaking and straining existing bonds of the matrix or initiating the undesirable morphology and growth of the depositing films. It is toward the goal of achieving a more perfect tetrahedral introduction of boron and/or lower order (monoatomic) boron species than heretofore possible that the present invention is directed.

Unlike crystalline silicon which is limited to batch processing for the manufacture of solar cells, the aforedescribed, high efficiency amorphous silicon alloys can be deposited in multiple layers over large area substrates to form solar cells in a high volume, continuous processing system. It is now known that a substrate may be continuously advanced through a succession of interconnected, environmentally protected deposition chambers, wherein each chamber is dedicated to the deposition of a specific semiconductor material. In making a photovoltaic device, for instance, of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. The layers of semiconductor alloy material thus deposited in the vacuum envelope of the deposition apparatus may be utilized to form photoresponsive devices, such as, but not limited to photovoltaic cells which include one or more p-i-n type cells. Note that as used herein the term "p-i-n type" will refer to any sequence of p and n or p, i, and n semiconductor alloy layers. Additionally, by making multiple passes through the succession of deposition chambers, or by providing an additional array of deposition chambers, multiple stacked cells of various configurations may be obtained and conformally deposited upon an irregularly contoured substrate.

It is important to note that trace amounts of boron are routinely incorporated into the intrinsic semiconductor alloy layer, hence the reason that the intrinsic layer is modified by the term "substantially" in the present application. Applicants' have found it desirable to purposely introduce the trace levels of boron, in the range of approximately ten ppm or less, into at least a portion of the intrinsic semiconductor alloy layer in order to accomplish such functions as, inter alia, increasing the open circuit voltage and increasing the fill factor. The boron, even though incorporated in such low levels, may serve to improve the field profile (thereby improving the collection of charge carriers) and aid in the stabilization of the intrinsic semiconductor alloy layer. Further, the addition of fluorine may also serve to further stabilize said intrinsic semiconductor alloy layer.

Although the reasons for the poor performance of semiconductor alloy layers which were fabricated by incorporating a diborane precursor gas as a source of boron for p-doping the semiconductor alloy material are not fully understood, it is known, as alluded to hereinabove, that even though diborane is a dimer of $BH_3$, under the influence of the electromagnetic field existing in the plasma region created by the glow discharge deposition process, diborane tends to produce higher boron oligomers and polymers, referred to herein as "non-monoatomic boron species". These higher order boron hydrides are very difficult to decompose in the electromagnetic field developed during the course of the glow discharge deposition process, and consequently tend to be incorporated into the semiconductor alloy material in the form of chains of boron. In this manner, the boron which is incorporated into the host matrix of the semiconductor material tends to alloy with, rather than substitutionally dope, that semiconductor material matrix. It is also believed that the boron atom, which is produced by the glow discharge decomposition of diborane gas, tends to be incorporated in said semiconductor alloy matrix in three-fold coordination. This is because boron, having three valence electrons, has a tendency to form three covalent bonds. Further, the large degree of rotational freedom present in a disordered, semiconductor alloy matrix provides a sufficient degree of freedom in the structural arrangement of atoms for the boron atoms to be incorporated thereinto in trivalent form. Whereas, the boron deposited by such glow discharge decomposition of diborane tends to assume three-fold coordination, as mentioned hereinabove, boron must be four-fold coordinated in order to act as an acceptor, and thereby most effectively dope the semiconductor alloy material. For this reason, effective doping levels of boron derived from diborane can be much less than the actual concentration of boron atoms incorporated into the amorphous semiconductor alloy matrix. As a result of the foregoing discussion, it should be apparent that a high density of strained and broken bonds as well as morphological and growth problems are normally introduced into the matrix of the semiconductor alloy by atoms of boron or molecules of boron species which are incorporated in an oligomeric or a polymeric form, or by atoms of boron or molecules of boron species which are present in three-fold coordinated form; both of which shall be referred to hereinafter as the non-substitutional incorporation of boron and/or boron species into the host matrix of the semiconductor alloy material.

In the manufacture of semiconductor devices, it is obviously desirable to substitutionally incorporate a high concentration of boron into the semiconductor alloy matrix in order to obtain the highest possible operating efficiency of said devices. Accordingly, it is desirable to utilize a precursor dopant material which exhibits as high a degree of substitutional incorporation of the dopant atoms thereof into the semiconductor alloy matrix as possible, so as to provide as low a density of broken and strained matrix bonds as possible. The presence of broken, strained, popped, dangling or other deleterious bonding configurations in the matrix as well as undesirable morphology and growth of the semiconductor film, in even the thin semiconductor alloy layers which are deposited by the aforementioned glow discharge processes, results in the deposition of a semiconductor layer exhibiting high internal stress and/or undesirable morphological growth. Stress strain and the presenced of undesirable morphologies may, in some cases, manifest themselves in the form of cracked, peeling or hazy semiconductor layers as well as degraded electrical performance of device incorporated those layers; and in situations wherein it is desirable to deposit thicker semiconductor layers, the stress and morphological problems are exacerbated. Moreover, it has been found by Applicants that cloudy and/or hazy semiconductor layers present poor optical properties as well as poor electrical properties. Obviously, if the p-doped layer becomes cloudy, it is absorbing or scattering incident light from the solar spectrum, which light should preferably be transmitted for photoconversion by the intrinsic semiconductor alloy layer. Therefore, this condition cannot be tolerated. Another feature described herein, relates to the substantaial elimination of the deposition of such hazy p-doped films of semiconductor alloy material.

It is important to note that while the foregoing paragraphs deal with commonly recognized scientific beliefs regarding the reasons for poor substitutional doping of amorphous semiconductor alloys using a diborane precursor gas, such beliefs have not as yet attained the status of dogma and represent only one plausible explanation for the inadequate p-doping achieved using a diborane precursor gas. However, regardless of the scientific explanation attributed to the presence of high concentrations of strain and deleterious morphology and growth in p-doped, thin film semiconductor alloys produced by glow-discharge deposition using silane and diborane precursor gases, it is patently clear that (1) a high density of defect states are introduced into the band gap, (2) the band gap of the semiconductor alloy is narrowed, thereby causing the alloy to absorb an undesirably high amount of the incident solar spectrum, (3) semiconductor alloy films so deposited show marked degradation when such films are used as the photogenerative layer of a photovoltaic device, (4) such semiconductor alloy films are very highly stressed which substantially limits the utility of very thick layers, as will be further demonstrated hereinafter.

While the mechanism by which photodegradation of the amorphous semiconductor alloy film is also not fully understood, it is safe to state that said photodegradation produces an increase in the number of defect states in the band gap of the semiconductor alloy material. The term "defects" or "defect states", as generally used by routiners in the field of amorphous semiconductor materials, is a broad term generally including all deviant atomic configurations such as broken bonds, dangling bonds, bent bonds, vacancies, microvoids, etc. In a photovoltaic device, a charge carrier pair (i.e. an electron and a hole) is generated in response to the absorption of photons from the incident radiation in the photoactive region of the semiconductor alloy material thereof. Under the influence of an internal electric field established by the doped layers of semiconductor alloy material of the photovoltaic device, such as a solar cell, the charge carriers are drawn toward the opposite electrodes of the cell causing the positively charged holes to collect at the negative electrode and the negatively charged electrons to collect at the positive electrode thereof. Under ideal operating conditions, every photogenerated charge carrier would be conducted to its respective collection electrode. However, operating conditions are not ideal and the loss of charge carriers occurs to some degree in all photovoltaic devices. The primary charge carrier collection loss is due to charge carrier recombination wherein an electron and a hole are reunited. Obviously, charge carriers that reunite or recombine are not available for electrode collection and the resultant production of electrical current. Defects or defect states that occur in the photoactive region of the semiconductor material of the photovoltaic device provide recombination centers which facilitate the reunion and recombination of electrons and holes. Therefore, the more defects or defect states that are present in the band gap of the semiconductor alloy material of a device, the higher the rate of charge carrier recombination therein. Accordingly, charge carrier collection efficiency decreases as the rate of charge carrier recombination increases within the photoactive region of the given semiconductor material. The increase in the number of defect states is therefore at least partially responsible for an increase in the rate of charge carrier recombination and a concommitant decrease in photovoltaic cell conversion efficiency.

Such photodegradation upon prolonged light exposure has been experimentally shown to affect many of the electrical and optical properties of hydrogenated fluorinated amorphous silicon alloys, i.e., light induced changes have been observed in dark conductivity, photoconductivity, photoluminescence, spin density, and gap state density. The effects of prolonged light exposure have been found to be metastable so that annealing the semiconductor alloy materials at temperatures above 150° C. for several hours restores the original value of the various properties. It is very noteworthy that there is a difference in the annealing behavior between undoped and very lightly p-doped materials which may be attributed to the structural difference in the two materials. It has been observed that boron doping with diborane (at a level of $B_2H_6/SiH_4=50$ ppm) weakens the hydrogen bonding configuration. This results in a lower activation energy for both creation and annealing of defects since it is generally believed that the defect creation involves breaking of a weak bond.

In an attempt to eliminate at least some of the aforementioned deleterious effects resultant from diborane doping of amorphous semiconductor alloy materials, scientific investigators have experimented with other boron-containing species, such as boron trifluoride ($BF_3$), to be used as the boron precursor gas.

In an article published in *Journal of Electronic Materials*, Volume 12, No. 6 1983 entitled "BF$_3$-Doped Amorphous Silicon Thin Films" by A. H. Mahan et al, a method for the radio frequency glow discharge deposition of $BF_3$ doped amorphous silicon is disclosed. As described therein, boron is incorporated into amorphous silicon alloy films by including boron trifluoride gas in the glow discharge deposition atmosphere created in the deposition chamber. The authors, depositing films from an atmosphere of silane and boron trifluoride, found that at the highest boron levels employed, (i.e., 3.5 percent $BF_3$ in silane), 1.8 atomic percent of boron was incorporated into the silicon alloy films, said films characterized as having an activation energy of 0.34 electron volts and a band gap substantially similar to that of undoped amorphous silicon alloys. According to the authors, the results represented the largest amount of boron capable of being incorporated into the semiconductor alloy host matrix via the use of $BF_3$. While samples of amorphous silicon alloys doped with higher boron levels could be prepared utilizing diborane; samples thus prepared exhibited decreased band gaps and a higher density of defect states in the band gap of the semiconductor alloy.

In the discussion section of the Journal article, the authors recognize the advantages of utilizing boron trifluoride as a dopant, especially with regard to the maintainance of a constant band gap in the doped semiconductor alloy material and suggest that boron trifluoride doped silicon may be advantageously utilized to form the p-player of a p-i-n type photovoltaic device. However, the authors further state that the dopant incorporation ratio decreases steadily as the boron trifluoride concentration is increased and therefore problems are encountered in obtaining high levels of doping utilizing $BF_3$. Therefore, while Mahan, et al recognize the need for a heavily p-doped silicon semiconductor alloy material having a relatively wide band gap, both (1) their own experiments and (2) their discussion in the paper indicate that $BF_3$ cannot be utilized to substitutionally incorporate sufficient concentrations of boron for doping the alloy material.

In a paper entitled "$BF_3$-Doped Amorphous Silicon Thin Films", G. Devaud,. et al of the Solar Energy Research Institute, Golden Colorado, also disclose the use of boron trifluoride as a dopant for amorphous silicon alloy films. Although they recognize the utility of $BF_3$ as a precursor dopant gas which does not alter the band gap of said amorphous alloys, Devaud, et al were unable to incorporate sufficient amounts of boron into their films to fabricate a highly doped p-layer of amorphous semiconductor alloy material.

U.S. Pat. No. 4,409,424 of Devaud, entitled "Compensated Amorphous Silicon Solar Cell" discloses subject matter substantially similar to that of the aforementioned paper. Specifically, the Devaud patent discloses the use of $BF_3$ only for the compensation mode doping of the intrinsic semiconductor alloy layer of a p-i-n type photovoltaic cell. Diborane, rather than $BF_3$, was utilized as the precursor gas from which to form the p-doped layer of the p-i-n cell, presumably, because of the inability of $BF_3$ to sufficiently p-dope the amorphous silicon alloy to a level sufficient to provide for the fabrication of a high quality photovoltaic cell. It will be noted that while the Devaud patent and the Devaud, et al paper disclose the use of deposition atmospheres containing up to 10% $BF_3$ therein, those atmospheres are still inadequate for the deposition of a p-doped silicon alloy film. Accordingly, the aforementioned reference also teach away from the instant invention insofar as they imply that high doping levels cannot be achieved by utilizing $BF_3$ in combination with silane in a glow discharge process.

It has recently been brought to Applicant's attention that R. V. Kruzelecky, et al, (Journal of Non-Crystalline Solids, V. 79, N1-2, pp. 19-28, 1986) working at the University of Toronto in Toronto, Ontario have done research on the doping of amorphous silicon alloys with boron trifluoride by glow discharge deposition. Kruzelecky, et al determined that boron trifluoride-doped amorphous silicon alloy films exhibit substrate dependent problems of adhesion which they attributed to the use of $BF_3$. The silicon alloy films of Kruzelecky, et al were prepared by the glow discharge decomposition of mixtures of silane and $BF_3$. The most heavily doped boron containing film thus obtained had an activation energy of 0.31 eV, thus being substantially similar to the silicon alloy films described above with respect to the Devaud, et al references. Analysis of the films revealed that only approximately 0.2 to 0.5 atomic percent of boron and a similar amount of fluorine were incorporated thereinto. As in all of the silicon alloy films described in the foregoing references, no significant narrowing of the band gap occured with $BF_3$ doping.

All of the aformentioned references, whether taken singly or collectively, accentuate the desirability of using $BF_3$ as the precursor gas from which to p-dope amorphous silicon alloys insofar as $BF_3$ does not substantially narrow the band gap of the semiconductor alloy materials in which it is incorporated, indicating that the boron therefrom is incorporated substitutionally into the host matrix of the semiconductor alloy material. However, the references also proceed to demonstrate the desirability of achieving higher levels of substitutional boron doping than was attained. That is to say, the prior art acknowledges that it would be highly desirable to provide a non-degradable, heavily doped, p-type semiconductor alloy having a relatively wide badn gap layer included in a p-i-n type photovoltaic cell; i.e., such a p-layer (1) exhibiting a relatively wide band bap (i.e. approximately 1.7 eV), (2) being relatively unstressed, and (3) producing more desirable chains of boron species when decomposed. It should be noted that while all of the foregoing references speak of the desirability of achieving high doping concentration of boron in the semiconductor alloy material, they (1) acknowledge and demonstrate that they are incapable of p-doping the silicon alloy material to the extent necessary to make said alloy material function as an efficient p-doped layer and (2) incorrectly state that $BF_3$ increases the stress imparted to the deposited silicon alloy film. Further, relative to the intrinsic semiconductor alloy layer, the references make no mention whatsoever of improved Staebler-Wronski stability.

It should be emphatically noted that the use of the invention disclosed and claimed herein is not limited to photovoltaic devices. P-type semiconductor alloy layers may be incorporated in thin film electronic devices or in relatively thick electrophotographic devices. The employment of the substantially monoatomic boron halides and pseudo-halides, from which to fabricate the multilayered photoreceptor of an electrophotographic device, forms a particularly noteworthy use of the improved semiconductor alloy materials of the instant invention.

As discussed hereinabove, p-type semiconductor alloy material deposited from an atmosphere which includes diborane as a precursor gas demonstrates a marked tendency to form higher order boron hydrides, which higher order species are incorporated into the host matrix of the semiconductor alloy material. The result of incorporating such non-monoatomic, higher order boron species into the matrix of even a thin film semiconductor alloy is the deposition of a semiconductor alloy material which exhibits high stress, undesirable morphologies in those areas of the deposited alloy material which have incorporated those higher order boron species, undesirable growth of the semiconductor alloy material, and an increased propensity to cracking and peeling of that semiconductor alloy material from the subjacent surface upon which it is deposited.

The aforementioned properties, which result from the higher order boron species being incorporated into a thin film matrix, are multiplexed if it is desired to deposit a relatively thick layer of semiconductor alloy material, as is the case with the deposition of a 25 micron thick electrophotographic photoreceptive member. While it is very difficult to measure internal stresses and strains in thin film semiconductor layers, even when such layers are on the order of 25 microns thick, the presence of stress in a semiconductor layer may be inferred. It has been found in the fabrication of electrophotographic media that by varying parameters such as, substrate temperature and reaction gas composition, semiconductor alloys with varying degrees of stress in the matrix thereof may be fabricated. It has further been found that such stressed electrophotographic photoreceptors are characterized by a generally hazy appearance and a low charge storage capacity (i.e. low Vsat.). It has also been noted that such highly stressed films have a tendency to form cracks and to peel away from the substrate. It is generally postulated that the low Vsat is exhibited by stressed layers resultant from charge dissapation ocurring along the boundaries of cracks, and it is also thought that strained regions themselves may provide paths for charge dissipation without actually forming cracks.

Cracks, or strained regions can also act as nucleation centers for the growth of undesirable morphologies, and such regions of undesirable morphology can then perpetuate through the matrix of the semiconductor alloy material to yield large areas of semiconductor material which are alloyed with long chains of higher order boron species. Obviously, it would be desirable to fabricate electrophotographic photoreceptors having relatively thick semiconductor alloy layers therein characterized by a low degree of internal stress desirable growth and morphology.

The principles and advantages of the instant invention will be readily apparent from the drawings, the description of the drawings and the examples which follow.

BRIEF SUMMARY OF THE INVENTION

As a first embodiment of the present invention there is disclosed herein a method for the roll-to-roll production of an electronic device by depositing a plurality of superposed layers of semiconductor alloy material onto a web of substrate material which is adapted to pass through at least one vacuum deposition chamber maintained at subatmospheric pressure. The method includes the steps of passing the web of substrate material through the first chamber for the deposition thereonto of a first doped semiconductor alloy of a first conductivity type, breaking vacuum, and subsequently passing the web of substrate material through either (1) at least one further chamber or (2) the same chamber for the deposition thereonto of at least one further semiconductor alloy layer. Since at least one of the subsequently deposited layers is of a conductivity type different from the conductivity type of the first deposited layer, the deposition of all of the semiconductor alloy layers may proceed without the requirement of a single vacuum envelope. In those instances in which the method is used to produce a photovoltaic cell, the method includes the further steps of depositing a p-doped layer of semiconductor alloy material in the first chamber, breaking vacuum, depositing an intrinsic layer of semiconductor alloy material in the second chamber, and depositing an n-doped layer of semiconductor alloy material in the third chamber. The vacuum may also be broken between the deposition of the semiconductor alloy material in the second and third chambers. When a tandem p-i-n type photovoltaic cell is to be fabricated; the method will also include the repetition of the depositing and vacuum breaking steps for each cell of the photovoltaic device. Preferably, the first deposited layer is a p-doped semiconductor alloy material and the p-doped layer and the web of substrate material may be stored prior to the deposition of subsequent layers of semiconductors alloy material. The p-doped semiconductor alloy material preferably includes a boron species that remains substantially monoatomic so that only substantially monoatomic boron is incorporated into the host matrix of the semiconductor alloy material. The p-doped alloy layer further includes a halogen or a pseudo-halogen. The boron species is selected from the group consisting essentially of $BF_3$, silicon trichloride-boron difluoride, substituted boron halides, boron pseudo-halides and mixtures thereof. The halogen or pseudo-halogen is preferably fluorine, the semiconductor is preferably silicon or a silicon alloy, and the boron is preferably tetrahedrally incorporated into the semiconductor alloy host matrix. Trace levels of boron may be incorporated into the intrinsic semiconductor alloy layers by grading said boron through a portion of the bulk of the intrinsic layer. Fluorine may be incorporated into the intrinsic layer for reducing the density of defect states in the band gap thereof and stabilizing the boron atoms by filling the vacant orbitals thereof.

As a second embodiment, there is disclosed in the present application, apparatus for the roll-to-roll production of an electronic device through the deposition of a plurality of layers of semiconductor alloy material onto a web of substrate material by a vacuum deposition process. The apparatus includes a plurality of deposition chambers adapted for the vacuum deposition of semiconductor alloy layers of differing conductivity types, means for transporting the web of substrate material through at least one of the deposition chambers, and a non-vacuumized path of travel which the web of substrate material is adapted to traverse between the deposition of at least one pair of adjacent layers of semiconductor alloy material. In this manner, a vacuum envelope encapsulating the entire path of travel of substrate material as said web passes through all of the deposition chambers is unnecessary. In a preferred embodiment, at least one triad of deposition chambers is provided for depositing at least one triad of layers of p-i-n semiconductor alloy material and the web of substrate material may be subjected to non-vacuum conditions between each pair of adjacent deposition chambers. At least the first deposition chamber includes a source of $BF_3$ and means for introducing $BF_3$ into the deposition chamber. The incorporation of the boron species into the semiconductor alloy matrix is monoatomic so as to reduce surface bonding with elements and compounds present in a non-vacuum atmosphere.

In the third embodiment of the present invention, an improved semiconductor alloy material is fabricated, which alloy material includes at least trace amounts of a p-dopant. The alloy material (1) has incorporated into the host matrix thereof at least boron and a halogen or a pseudo-halogen, and (2) is characterized by a surface substantially passivated to elements and compounds present in the ambient atmosphere. Preferably the halogen or pseudo-halogen is borane, the semiconductor is silicon or a silicon alloy and the boron is tetrahedrally incorporated into the semiconductor host matrix.

In a fourth embodiment of present invention, there is disclosed an improved semiconductor alloy material including at least trace amounts of a p-dopant, said material having incorporated into the host matrix thereof at least boron and a halogen or a pseudo-halogen. The boron and halogen or pseudo-halogen is substantially incorporated in monoatomic form so that said semiconductor alloy material exhibits substantially reduced bulk stress. In this manner the oligomeric and polymeric incorporation of boron species is substantially reduced so as to correspondingly reduce the nucleation of undesirable morphology and growth of the semiconductor alloy material. Preferably the halogen or pseudo-halogen is fluorine, the semiconductor is silicon or a silicon alloy, and the boron is tetrahedrally incorporated into the semiconductor host matrix.

In a fifth embodiment of the present invention, there is disclosed an electronic device which includes at least one pair of adjacent p-doped and n-doped thin film semiconductor alloys so as to form a tunnel junction between the doped layers, the tunnel junction being indicated by a kink in the first quadrant of the IV curve thereof, i.e., the kink repesents the impediment encountered by charge carriers tunneling through the p-n interface. The improvement comprises the improved tunneling of charge carriers through the interface to such an extent that the kink in the first quadrant of the IV curve thereof is substantially eliminated. At least one of the p-doped layers includes at least boron and a halogen or pseudo-halogen. Preferably the halogen or pseudo-halogen is fluorine, the semiconductor is silicon or a silicon alloy, and the boron is tetrahedrally incorporated into the semiconductor host matrix. In a preferred form, the device is a tandem p-i-n type photovoltaic device formed of at least two cells.

In a sixth embodiment of the present invention, there is disclosed a photovoltaic device which includes a substantially intrinsic thin film semiconductor alloy layer sandwiched between a p-doped and an n-doped thin film semiconductor alloy layer. The p-doped layer incorporates at least boron and the halogen or pseudo-halogen therein. The improvement comprises having the p-doped layer (1) monoatomically incorporate the boron species in the semiconductor matrix, (2) exhibit reduced bulk stress, and (3) be characterized by a band gap substantially equal to the band gap of the undoped semiconductor alloy. The intrinsic layer monoatomically incorporates at least trace amounts of boron. The device is characterized by reduced Staebler-Wronski degradation, the field at the n-doped/intrinsic interface is enhanced and minimum light absorbtion occurs in the p-doped layer. Preferably, the halogen or pseudo-halogen is fluorine, the semiconductor is silicon or a silicon alloy, and trace levels of boron are graded through at least a portion of the intrinsic layer from a maximum at the p-doped side thereof.

As a seventh embodiment of the present invention, there is disclosed a method of fabricating an improved semiconductor alloy material which includes at least boron and a halogen or a pseudo-halogen incorporated into the semiconductor host matrix thereof. The method includes the steps of introducing a precursor semiconductor material for (1) decomposition in a plasma region developed by glow discharge and (2) deposition onto a substrate so as to form the semiconductor host matrix. The improved method includes the steps of providing a source of boron and halogen or pseudo-halogen as a precursor gas, introducing the gaseous boron species into the glow discharge plasma, and monoatomically incorporating the boron species into the semiconductor host matrix as the matrix is being formed so that at least approximately 1.9% of boron is incorporated into the deposited film. In this manner, an improved p-doped alloy is deposited, which alloy is characterized by substantially reduced nucleation of undesirable morphology and growth of the semiconductor alloy material. Preferably $BF_3$ is incorporated as the gaseous boron species, fluorine is the halogen or pseudo-halogen, silicon or a silicon alloy is the semiconductor material and the boron atoms are substantially tetrahedrally incorporated into the semiconductor host matrix. A photoresponsive device may be fabricated by forming a p-doped layer from the improved semiconductor material, forming an n-doped semiconductor alloy layer, forming a substantially intrinsic semiconductor layer between the p-doped and n-doped layers, and introducing trace levels of boron from the precursor boron species gas into the host matrix of the semiconductor material of the intrinsic layer. In this manner, the boron containing intrinsic layer operates to substantially reduce Staebler-Wronski degradation. The substantially intrinsic semiconductor alloy layer may initially be slightly n-type and the step of introducing boron comprises the introduction of boron in an amount sufficient to compensate the semiconductor alloy material and move the Fermi level toward the valence band. Alternately, the amount of boron may be varied to move the Fermi level to approximately mid-gap.

In an eighth embodiment of the present invention, there is disclosed a semiconductor structure which has at least one thin film p-doped semiconductor alloy layer upon which at least one other thin film semiconductor alloy is subsequently deposited. The p-doped semiconductor alloy has at least boron incorporated into the semiconductor host matrix. The improvement comprises the monoatomic incorporation of the boron into the semiconductor alloy host matrix so as to provide a morphologically improved surface for the growth of subsequently deposited semiconductor alloy layers. In this manner, a non-cloudy, non-hazy series of semiconductor alloy layers are presented for the passage therethrough and subsequent absorbtion thereby of incident solar radiation. The p-doped semiconductor alloy material further includes a halogen or a pseudo-halogen, preferably fluorine, the semiconductor is preferably silicon or a silicon alloy and the boron is preferably tetrahedrally incorporated into the semiconductor host matrix.

In a ninth embodiment of the present invention, there is disclosed an electrophotographic photoreceptor of the type which includes an electrically conductive substrate and a photoconductive member in electrical communication therewith. The improvement comprises having the photoconductive member formed of a semiconductor alloy material including at least trace amounts of boron and a halogen or pseudo-halogen in the semiconductor host matrix thereof. The boron and halogen or pseudo-halogen is substantially incorporated in monoatomic form so as to reduce bulk stress in the semiconductor body. In this manner, the oligomeric and polymeric incorporation of boron species is substantially reduced so as to provide a photoconductive member characterized by improved charge storage capability. Normally, the photoconductive member is at least 20 microns thick and formed of a semiconductor alloy material including at least a silicon alloy in the semiconductor host matrix thereof. Preferably, the halogen or pseudo-halogen is fluorine and boron is tetrahedrally incorporated into the semiconductor host matrix. The photoconductive member may be formed of an amorphous silicon:hydrogen:fluorine alloy including sufficient amounts of boron therein to provide an activation energy in the range of 0.8 to 1.2 eV. A blocking layer may be interposed between the photoconductive member and the substrate, the blocking layer formed of a semiconductor alloy material having a conductivity type chosen to inhibit the injection of charge carriers from the substrate into the photoconductive member. Preferably, the blocking layer is formed of an amorphous silicon:hydrogen:fluorine alloy and includes a greater amount of boron therein than does the photoconductive member. An adhesion promoting layer is preferably interposed between the substrate and the blocking layer, and an insulative layer is preferably disposed atop the photoconductive layer.

In a tenth embodiment of the present invention there is disclosed an improved electrophotographic photoreceptor of the type including an electrically conductive substrate and a photoconductive member in electrical communication therewith. The improved photoreceptor is formed of a plurality of superposed layers of semiconductor alloy material, the superposed layers differing in the concentration of at least one element thereof. In this manner, the bulk stress within the photoconductive member is relieved so as to improve the charge storage capability of the photoreceptor. Preferably, (1) each of the superposed layers of semiconductor material include at least trace amounts of boron and a halogen or a pseudo-halogen in the host matrix thereof, and (2) the boron and halogen or pseudo-halogen is substantially incorporated in monoatomic form so as to reduce the incorporation of oligomeric and polymeric boron species as well as reducing bulk stress. In the preferred embodiment, the photoconductive member is approximately 15 to 30 microns thick and displays columnar growth morphology. The photoreceptor further includes a blocking semiconductor alloy layer interposed between the photoconductive member and the substrate, the semiconductor layer being approximately 2000 to 6000 angstoms thick and including therein boron in an amount greater than a photoconductive member. There is also an adhesion promoting layer of approximately 500 to 2000 angstroms interposed between the blocking layer and the substrate, and an electrically insulating layer of less than 6000 angstroms thick disposed stop the photoconductive member.

In an eleventh embodiment of the present invention, there is disclosed a glow discharge deposition method for the production of an improved electrophotographic photoreceptor of the type including a photoconductive member. The method includes the steps of disposing an electrically conductive substrate member in a glow discharge deposition apparatus, providing a photoconductive member precursor gas which includes a source of substantially monoatomic boron and a halogen or pseudo-halogen, providing a semiconductor host matrix forming gas, energizing said precursor gases with electromagnetic energy to decompose same so as to deposit a semiconductor host matrix, and substantially monoatomically incorporating the boron and halogen or pseudo-halogen in said matrix. In this manner, a photoconductive member exhibiting substantially reduced bulk stress, and increased charge storage capability is provided. The energization of the precursor gas may be by radio frequency or microwave energy. Preferably, the precursor gas comprises silicon or a silicon alloy in combination with fluorine and hydrogen. The method may further include the steps of changing the composition of the precursor gases after a first portion of the photoconductive member is deposited and then depositing a second portion of the photoconductive member from a second composition of process gases. This is accomplished by changing the relative amounts of fluorine in the precursor gas mixture. In the most preferred embodiment, the precursor gases include silane, hydrogen, silicon tetrafluoride and boron trifluoride. A doped semiconductor layer is preferably disposed between the substrate and the photoconductive member by the glow discharge decomposition of a gaseous mixture including silane, silicon tetrafluoride, hydrogen and boron trifluoride. An adhesion promoting layer is deposited atop the substrate member, which layer is formed from a material chosen from the group consisting essentially of silicon nitride, silicon carbide, silicon oxide and combinations thereof. Finally, a layer of electrically insulating material is deposited atop the photoconductive member.

In a twelfth and final preferred embodiment of the present invention, there is disclosed a method of fabricating an improved p-doped semiconductor alloy material which includes at least boron and a halogen or pseudo-halogen incorporated into the semiconductor host matrix thereof. The method including the step of introducing a gaseous precursor mixture for (1) the plasma induced decomposition thereof and (2) the deposition thereof onto a substrate so as to form the p-doped semiconductor alloy material. The improved method includes the further steps of providing a boron and halogen or pseudo-halogen species in the precursor mixture, providing microwave energy to the precursor mixture so as to initiate a glow discharge plasma therefrom, and substantially monoatomically incorporating the boron species into the semiconductor alloy as said alloy is being deposited. In this manner, the alloy exhibits substantially reduced bulk strain and substantially reduced nucleation of undesirable morphology and growth of the semiconductor alloy material. The microwave energy is approximately 2.5 GHz, $BF_3$ is the source of boron in the gaseous precursor mixture, fluorine is the halogen or pseudo-halogen source in the precursor mixture and a silicon containing species or a germanium containing species forms the semiconductor source in the gaseous precursor mixture.

BRIEF DESCRIPTION OF THE DRAWINGS

FIG. 3A is an IV curve illustrating the typical performance of a tandem p-i-n photovoltaic cell which incorporates $B_2H_6$ doped layers of semiconductor alloy material;

FIG. 3B is an IV curve illustrating the typical performance of a tandem p-i-n photovoltaic cell, the cell differing from that of FIG. 3A only in the incorporation of of $BF_3$ doped layers of semiconductor alloy material;

DETAILED DESCRIPTION OF THE DRAWINGS

I. The Photovoltaic Cell

Figure 1:
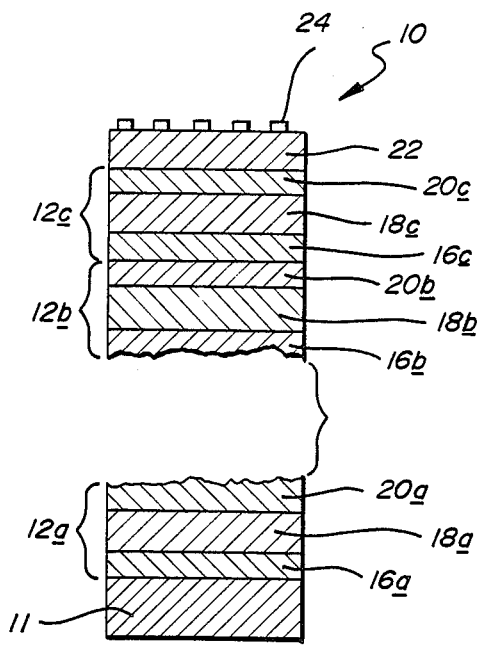
FIG. 1 is a fragmentary, cross-sectional view of a tandem photovoltaic device comprising a plurality of p-i-n type cells, each layer of the cells formed from a semiconductor material.

Referring now to the drawings and particularly to FIG. 1, a photovoltaic cell, formed of a plurality of successive p-i-n layers, each of which includes, preferably, an amorphous semiconductor material, at least one of said layers including a boron halide or pseudo-halide dopant therein is shown generally by the numeral 10.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to application of the amorphous material, for purposes of this application, the term "substrate" shall include not only a flexible film, but also any elements added thereto by preliminary processing. Also included within the scope of the present invention are substrates formed of glass or a glass-like material on which an electrically conductive electrode is applied.

Each of the cells 12a, 12b and 12c are preferably fabricated with an amorphous semiconductor body containing at least a silicon alloy. Each of the semiconductor bodies includes an n-type conductivity semiconductor, layer 20a, 20b and 20c; an intrinsic semiconductor layer 18a, 18b and 18c; and a p-type conductivity semiconductor layer 16a, 16b and 16c. Note that the intrinsic layer may include traces of n-type or p-type dopant material without forfeiting its characteristic neutrality. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the methods and materials of this invention may also be utilized to produce single or multiple n-i-p cells, p n cells, Schottky barrier cells, as well as other semiconductor or devices such as diodes, memory arrays, photoconductive devices and the like.

It is to be understood that following the deposition of the semiconductor layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
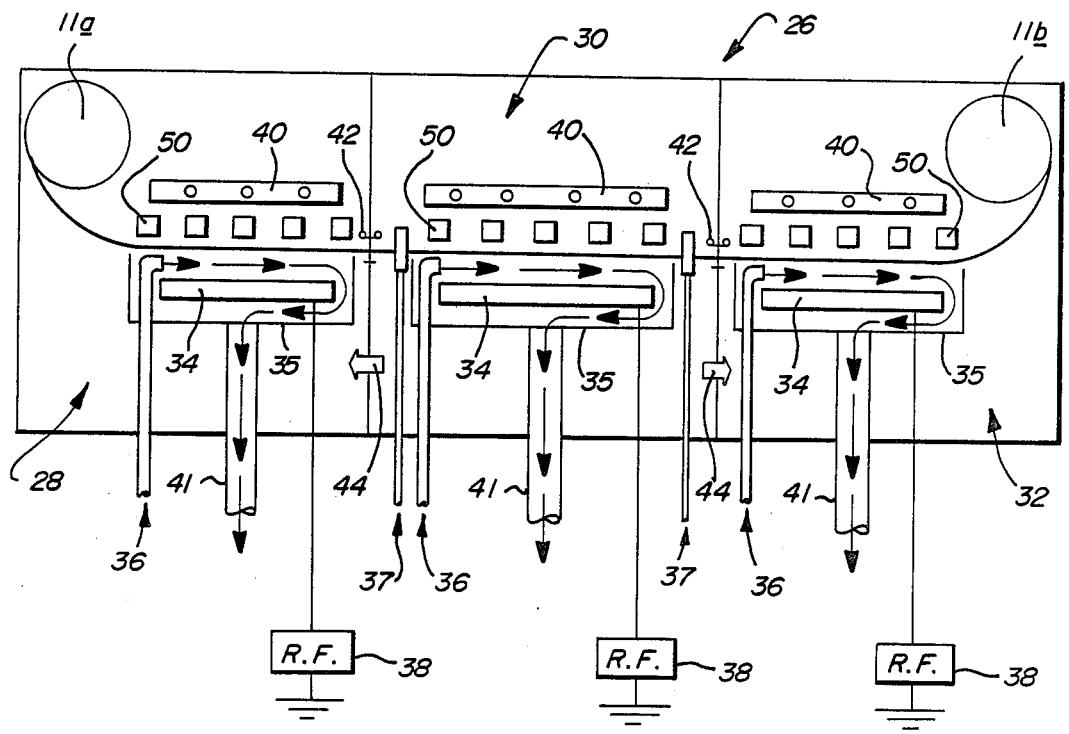
FIG. 2 is a diagrammatic representation of a multiple chamber glow discharge deposition system adapted for use in the continuous production of photovoltaic devices such as the cells shown in FIG. 1.

Turning now to FIG. 2, a diagrammatic representation of multiple glow discharge deposition apparatus for the continuous production of semiconductor cells is generally illustrated by the reference numeral 26. The apparatus 26 is illustrative of one type of glow discharge deposition system in which the boron-containing semiconductor alloy materials of the instant invention may be prepared, it being understood that such layers may also be deposited in other types of continuous and batch vacuum deposition systems as well as by other processes. The apparatus 26 includes a plurality of isolated, dedicated deposition chambers, each chamber of which is interconnected by a gas gate 42 through which (1) sweep gases, and (2) a web of substrate material 11 are adapted to unidirectionally pass.

The apparatus 26 is adapted to mass deposit amorphous semiconductor layers of p-i-n configuration onto the large area surface of the substrate material 11 which is continually fed therethrough. To deposit the semiconductor layers required for producing multiple p-i-n type cells, the apparatus 26 includes at least one triad of deposition chambers. Each triad of deposition chambers comprises: a first deposition chamber 28 in which p-type conductivity semiconductor layer is deposited onto the deposition surface of the substrate 11 as the substrate 11 passes therethrough; a second deposition chamber 30 in which in intrinsic semiconductor layer is deposited atop the p-type layer on the deposition surface of the substrate 11 as the substrate 11 passes therethrough; and a third deposition chamber 32 in which an n-type semiconductor layer is deposited atop the intrinsic layer on the deposition surface of the substrate 11 as the substrate 11 passes therethrough. It should be apparent that (1) although, only one triad of deposition chambers has been illustrated, additional triads or additional individual chambers may be added to the apparatus to provide the machine with the capability of producing photovoltaic cells having any number of p-i-n type semiconductor layers; (2) the substrate supply core 11a and the substrate take-up core 11b are shown in the deposition chambers for illustrative purposes only, while in reality the cores would be housed in separate chambers operatively connected to the deposition chambers; (3) although the glow discharge illustrated herein employs cathodes with r.f. power, other sources of electromagnetic energy, such as a.c. power generators, microwave generators and d.c. power generators, may be employed without departing from the spirit of the present invention; and (4) the process gases may be introduced to flow in a direction parallel but opposite to the direction of substrate travel.

Each deposition chamber, 28, 30 and 32 of the triad is adapted to deposit a single semiconductor layer, by glow discharge deposition, onto the electrically conductive substrate 11. To that end, each of the deposition chambers 28, 30 and 32 includes: a cathode 34; a shield 35 disposed about each of the cathodes 34; a process gas supply conduit 36; a radio frequency generator or other electromagnetic power source 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber. Additionally, an inert sweep gas conduit 37 is disposed on opposed sides of the intrinsic deposition chamber for directing an inert gas toward the dopant deposition chambers.

The supply conduits 36 are operatively associated with the respective cathodes 34 or other decomposition mechanism to deliver process gas mixtures to the plasma, or other decomposition regions created in each deposition chamber between said decomposition mechanism and the substrate 11. The cathode shields 35 are adapted to operate in conjunction with the web of substrate material 11 and the evacuation conduit 41 to confine the process gases within the cathode region of the deposition chambers. To this end, the shielding 35 abuts the cathode 34 in a leak-tight manner.

The radio frequency or other similar type of power generator 38 operate in conjunction with the cathodes 34, the radiant heaters 40 and the grounded substrate 11 to form the plasma by disassociating and recombining the elemental reaction gases entering the deposition chambers into deposition species and compounds. These species and compounds are then deposited onto the bottom surface of the substrate 11 as semiconductor layers. The substrate 11 is maintained substantially flat by the plurality of rows of magnetic elements 50 which provide an attractive force urging the substrate 11 upwardly, out of its normal sagging path of travel.

To form the photovoltaic cell 10 illustrated in FIG. 1, a p-type amorphous semiconductor layer is deposited onto the substrate 11 in the dopant deposition chamber 28, an intrinsic amorphous semiconductor layer is deposited atop the p-type layer in the deposition chamber 30 and an n-type amorphous semiconductor layer is deposited atop the intrinsic layer in the deposition chamber 32. As a result, in the preferred embodiment, the apparatus 26 deposits at least three amorphous semiconductor layers onto the substrate 11 with the intrinsic layer deposited in deposition chamber 30 differing in composition from the layers deposited in deposition chambers 28 and 32 by the absence of large amounts of at least one element which will be referred to as the dopant or doping species.

It is essential to note that the deposition apparatus 26 illustrated and described with reference to FIG. 2 requires that the web of substrate material 11 assume a path of travel through each of the successive deposition chambers 28, 30 and 32 without breaking vacuum. This is because of the fact that, prior to the instant invention, it was feared the semiconductor alloy layers deposited in the respective deposition chambers, and especially the p-doped layer deposited in deposition chamber 28 would tend to form an oxide or other insulating layer with elements and compounds present in a non-vacuumized environment such as the ambient atmosphere. As a result, the deposition apparatus 26 requires the use of costly and intricately designed gas gates 42 which are adapted to interconnect each of said adjacent deposition chambers while isolating the gaseous atmospheres thereof and maintaining vacuum conditions between each of said deposition chambers.

III. The Boron Containing Material

In accordance with the principles of the invention described herein, there are provided improved p-type and intrinsic amorphous semiconductor alloys having incorporated into the host matrix thereof various concentrations of monoatomic boron and a halogen or pseudo-halogen material. The presence of monoatomic boron and a halogen or pseudo-halogen in specific proportions which boron species are substantially tetrahedrally coordinated, serves to (1) impart desirable morphological and growth related features to the depositing semiconductor alloy film, (2) substantially reduce the effects and/or occurrence of Staebler-Wronski degradation in the intrinsic semiconductor alloy film, (3) maintain the band gaps of altered alloys effectively equal to those of comparable undoped semiconductor alloys, (4) reduce bulk stress in semiconductor alloy films and (5) prevent the deposition of hazy and cloudy looking semiconductor alloy films.

There is also provided an improved method of p-doping a semiconductor alloy material in a glow discharge deposition process so as to produce more efficiently doped p-type layers of semiconductor alloy material and p-n and p-i-n junction photovoltaic devices incorporating said more efficiently p-doped material. Whereas the methods of making p-doped films taught by the prior art have been predominantly limited to the use of conventional dopant precursor gases, such as diborane, which polymerizes under glow discharge deposition conditions optimized for intrinsic semiconductor alloy materials, the method disclosed herein utilizes the characteristic behavior of monoatomic boron-halogens and pseudo-halogens in a glow discharge plasma, which boron species tend to remain substantially monoatomic, so as to fabricate superior p-type semiconductor alloys.

As used in the discussion which follows, the phrase "monoatomic boron species" refers to a boron species that includes a single boron atom therein and which remains in a monoatomically stable state under preferred glow discharge deposition operating conditions. It is an important characteristic of said monoatomic boron species that boron is deposited therefrom in a substantially monoatomic form, i.e., few, if any, high order polymeric or oligomeric boron chains are incorporated into the semiconductor alloy host matrix. Glow discharge deposition conditions generally include temperatures of from about 200° C. to about 300° C., and preferably about 225° C., and pressures of from about 0.5 to about 1.0 torr and preferably about 0.65 to about 0.9 torr.

Also, as used in this application, the terms "halogens" and "halogens and pseudo-halogens" refer to (1) halogen-containing materials, and (2) other compounds which can be substituted for and specifically react as halogens in a glow discharge deposition reaction. As an example, boron trifluoride is a halogen-containing compound. CN-, CNO- and SCN-moieties are examples of pseudo-halogens which may be substituted for the fluorine atom in $BF_3$.

Whereas the discussion which follows hereinbelow is directed to the formation of intrinsic and p-type hydrogenated amorphous silicon alloys having monoatomic boron and a halogen or pseudo-halogen therein, it must be understood that the same dopant precursor materials may also be used successfully in other p-type and intrinsic amorphous semiconductor alloy materials such as silicon, germanium and silicon-germanium semiconductor alloys. Although the p-doping method and materials of the instant invention can be utilized to fabricate devices with various amorphous silicon semiconductor alloy materials, it is preferred that they be utilized with the fluorine and hydrogen compensated glow discharge deposited materials disclosed in Assignee's United States patents incorporated by reference hereinabove.

In order to more fully understand the reason that Applicants have found $BF_3$ to be a superior precursor source of boron for substitutionally adding boron to a semiconductor alloy matrix, note that diborane, $B_2H_6$, which is a dimer of $BH_3$, can react with itself at elevated temperatures to form higher order boron hydrides and boron-containing polymers and oligomers. The reaction of such multiple boron atom species to yield monoatomic boron for combination with the depositing semiconductor alloy host matrix is chemically disfavored; therefore the multiatomic boron species are incorporated into the matrix. Whereas, the presence of substitutionally incorporated boron in the hydrogenated amorphous material imparts p-type characteristics to the deposited film, the fact that most of the boron polymers are not substitutionally incorporated in the deposited film undersirably lowers the band gap of the semiconductor alloy and the electrical conductivity of such an alloy. Thus, the heretofore employed precursor boron dopants for p-type semiconductor alloy films cannot be added in amounts much greater than about ten atom percent (in the case of a typical hydrogenated amorphous silicon alloy film), since at higher levels, a high degree of contamination by multiatomic boron species occurs, rendering the semiconductor alloy material unsuitable for use in photovoltaic applications.

Boron species that remain monoatomically stable under the glow discharge deposition conditions, alluded to hereinabove, have been found to produce p-type amorphous semiconductor alloys having bandgap energies substantially equivalent to those of comparable intrinsic semiconductor alloy materials without detrimentally lowering the electrical conductivity of the so-formed alloys. It is indeed a noteworthy property that the incorporation of a monoatomic boron species which includes a halogen or pseudo-halogen in accordance with the principles of this invention produce p-doped amorphous semiconductor alloys having superior morphology, exhibiting better growth and reduced stress, while retaining band gaps substantially equal to the band gap of comparable undoped semiconductor alloys.

It has also been found that utilizing monoatomic boron species, such as $BF_3$, as the boron source, higher boron concentrations may be utilized in the gaseous glow discharge deposition process without forming undesirable higher order boron species. In contrast, boron species that are non-monoatomic during amorphous semiconductor alloy glow discharge deposition conditions may be present in the gaseous phase at untolerably high levels. Preferably, the ratio of $SiH_4$: Monoatomic boron species ranges from about 10:1 mole percent to about 1:1 mole percent.

Boron-containing materials that are monoatomically stable under glow discharge deposition conditions include boron trifluoride, silicon trichloride-boron difluoride, substituted boron halides, and boron-pseudohalides. Such materials do not readily combine to form polymeric boron materials under glow discharge conditions. As in the case of boron trifluoride, $BF_3$, pairs of electrons from the fluorine can back-conjugate so as to form such structures as:

This back-conjugation stabilizes the boron atom by filling a vacant orbital thereof, and the stabilized species is incorporated into the depositing semiconductor alloy host matrix in a substantially tetrahedral form, said form being necessary for the effective doping of that host matrix. Borane, $BH_3$, and diborane, $B_2H_6$, cannot be so stabilized because hydrogen does not have the extra electron pairs, provided by fluorine in $BF_3$, that allows said back-conjugation to occur.

The improved incorporation of boron into the semiconductor alloy host matrix leads to increased substitutional doping efficiencies and decreased levels of undesirable states in the band gap of the doped alloy materials. These improvements are important in the fabrication of highly doped semiconductor alloys layers such as the p-doped layer of a p-i-n photovoltaic device insofar as high doping concentrations can be achieved without significantly narrowing the band gap of the alloy or introducing a significant number of defect states. The improved doping ability resultant from following the principles enunciated by the instant invention also has significant utility in the fabrication of lightly doped layers of semiconductor alloy material, such as the intrinsic semiconductor alloy layers of p-i-n photovoltaic devices that incorporate trace levels of born. In such devices it has been found that Staebler-Wronski degradation of the intrinsic layer is significantly curtailed, and in some instances eliminated, by the substitutional incorporation of even trace amounts of boron in the manner prescribed herein. The improved substitutional incorporation of the dopant atoms into the host matrix and the decreased density of defect states in the band gap of the doped semiconductor alloy layer is believed to result in the fabrication of an improved semiconductor alloy material and the establishment of an enhanced field across the semiconductor alloy layers of devices incorporating the doped alloy material, thereby providing increased stability and photoconversion efficiencies in photoresponsive devices incorporating said heavily or lightly p-doped layers.

An additional and surprising benefit resulting from the use of monoatomic boron species for doping p-type amorphous semiconductor alloy material, the benefit having been alluded to hereinabove, appears when a tandem photovoltaic cell is formed incorporating the p-type alloy. As will be detailed in the following paragraph, the benefit relates to the improved interface created between the p-doped and n-doped layers of such a tandem cell.

The morphology of tandem amorphous semiconductor alloy photovoltaic cells, such as the one depicted in FIG. 1, and described hereinabove, has been studied and it has been found that problems arise in depositing the second p-doped layers onto the first n-doped layer because the p-doped layer appears to grow in a stressed manner which is manifested by a cloudy, hazy appearance in the final cell. This cloudiness and haziness is also acccompanied by a reduced overall efficiency of the photovoltaic cell since the haze interferes with the transmission of solar radiation therethrough. This is not acceptable for photovoltaic applications (wherein the absorbtion of light is to be predominantly accomplished by the intrinsic layers) and is often the cause for rejection of otherwise suitable materials for photovoltaic applications. Such hazing has even been seen when the second p-doped layer is omitted from a tandem configuration. It has been found however, that when the second p-doped layer of a tandem photovoltaic cell is fabricated utilizing a monoatomic boron species as the dopant, that p-doped layer may be deposited on n-doped layers with remarkable clarity.

It further appears that the inherent properties of the monoatomic boron species results in the deposition of a film having characteristics more suitable for charge carriers to pass through the tunnel junctions created between the adjacent p and n-doped layers of tandem p-i-n cells. This becomes clear by viewing the IV curves of tandem p-i-n cells fabricated with diborane as in FIG. 3A and with $BF_3$ as in FIG. 3B. A close perusal of the respective IV curves reveals that the kink 13 present in the first quadrant of the diborane IV curve has disappeared in the $BF_3$ IV curve. This is because the $BF_3$ is disassociated and incorporated into the matrix of semiconductor alloy material in such a manner that the charge carriers are able to tunnel through the p-doped layer/n-doped layer interface which exists between the upper and lower cells of the tandem photovoltaic device without encountering much, if any, resistance. The result is the more efficient photoconversion of incident light to electricity.

EXAMPLE 1

An amorphous silicon photovoltaic cell, generally similar to that cell 10 depicted in FIG. 1 was produced in the following manner:

a stainless steel substrate was disposed in the deposition chamber of a capacitivity coupled glow discharge system operated at 13.56 MHz. In order to deposit the various semiconductor alloy layers, the pressure in the chamber was reduced, the deposition gas atmosphere introduced and radio frequency energy provided to the cathode. The particular operating pressure, deposition atmosphere, power level and deposition time depended upon and varied slightly with the particular layer being deposited.

The $p_1$ layer was deposited from an atmosphere formed from a flow of 0.3 standard cubic centimeters per minute (i.e., sccm) of $SiH_4$, 0.03 sccm of $BF_3$ diluted with a sufficient amount of argon to maintain a pressure of 0.7 torr in the chamber. The substrate was maintained at a temperature of 225° C. for the deposition of this, as well as succeeding semiconductor alloy layers. The cathode was energized with 2 watts of power for 3 minutes. The result was the deposition of a 300 angstrom layer of p-doped silicon alloy layer.

After flushing the deposition chamber, the $i_1$ layer was similarly deposited from an atmosphere formed from a flow of 1.0 sccm of $SiH_4$, 8.88 sccm of $H_2$, 0.12 sccm of $GeH_4$, 10.0 sccm of argon said atmosphere maintained at a pressure of 0.75 torr. The r.f. power level was 3 watts. The deposition parameters were maintained for 3 minutes, resulting in the deposition of a substantially intrinsic silicon alloy layer 3300 angstroms thick.

The deposition chamber was then flushed with argon and the $n_1$ layer was deposited from a flow of 0.5 sccm of $SiH_4$, 1.5 sccm of $SiF_4$, 6.0 sccm of $H_2$, and 2.0 sccm of $PH_3$ maintained at a pressure of 0.9 torr. The r.f. power was 4 watts. The deposition parameters were maintained for 30 seconds, resulting in the deposition of an 80 angstrom thick $n_1$ layer of silicon alloy.

The deposition chamber was again flushed with argon and the $p_2$ silicon alloy layer deposited from an atmosphere of 0.2 sccm of $SiH_4$, 0.08 sccm of $BF_3$, and 39.72 sccm of Ar maintained at a pressure of 0.85 torr. The r.f. power was 3 watts. The deposition parameters were maintained for 40 seconds, resulting in the formation of an 80 angstrom thick $p_2$ silicon alloy layer.

The deposition system was again flushed with argon and the $i_2$ silicon alloy layer deposited from an atmosphere consisting of 3.0 sccm of $SiH_4$ and 7.0 sccm of $H_2$ maintained at a pressure of 0.5 torr. The r.f. power input was 2 watts. The deposition parameters were maintained for 10 minutes, resulting in the formation of a 1000 angstrom thick $i_2$ silicon alloy layer.

The deposition system was again flushed with argon and the $n_2$ silicon alloy layer deposited from an atmosphere of 0.5 sccm of $SiH_4$, 1.5 sccm of $SiF_4$, 7.0 sccm of $H_2$ and 1.0 sccm of $PH_3$ maintained at a pressure of 0.8 torr. The r.f. power was 4 watts. The deposition parameters were maintained for 25 seconds, resulting in the formation of a 80 angstrom thick $n_2$ silicon alloy layer.

A portion of the photovoltaic cell thus produced was analyzed and it was found that the first p-layer, that is the $p_1$ silicon alloy layer in physical contact with the substrate, had 1.5 percent boron and 0.6 percent fluorine incorporated therein. The $p_2$ silicon alloy layer was similarly found to contain 3.4 percent boron and 1.9 percent fluorine incorporated therein. The photovoltaic cell was then provided with a top electrode of indium tin oxide and a current collecting grid via evaporation processes well know to those skilled in the art. Upon measuring the electrical characteristics of the thus produced photovoltaic cell, it was found that, under AM1 conditions, the open circuit voltage, $V_{oc}$, was 1.553 volts; the short circuit current density, $J_{sc}$, was 8.377 milliamperes per square centimeter; the overall surface area of the cell was 0.25 $cm^2$; the fill factor was 0.666; and the overall photoconversion efficiency thereof was 8.667 percent.

EXAMPLE II

A series of very large area single (vis-a-vis, tandem) p-i-n type photovoltaic cells were prepared via a glow discharge deposition process similar to that process described in the foregoing example. These cells were each 16 inches square and included a p-doped semiconductor alloy layer of approximately 500 angstroms thickness, a substantially intrinsic semiconductor alloy layer of approximately 6000 angstroms thickness and an n-doped semiconductor alloy layer of approximately 150 angstroms thickness deposited upon a stainless steel substrate. The completed cells were each provided with a 600 angstrom thick indium tin oxide top electrode and a screen printed, current collecting grid pattern deposited on the electrode. The deposition parameters and precursor reaction gas mixtures were similar to those parameters and mixtures employed in the foregoing example.

Three sample photovoltaic cells were prepared utilizing different precursor reaction gas mixtures for the various semiconductor alloy layers so as to assess the improvement resulting from the use of boron-halides and pseudo-halides of the instant invention. It should be noted at this point that single p-i-n cells of 6650 angstroms thickness, such as those prepared in this example, will, under normal operating conditions, exhibit a high degree of photodegradation (Staebler-Wronski degradation) owing to the relatively thick intrinsic layer (approximately 4000 angstrom thick) and the consequently low electric field developed thereacross by the doped semiconductor alloy. This is in direct contrast to relatively thin p-i-n cells of about 1000 to 3000 angstroms thickness, the intrinsic semiconductor alloy layer of which has a relatively high electric field developed thereacross.

Sample 1 employed diborane as the precursor gaseous source of boron for both the p-doped semiconductor alloy layer and the intrinsic semiconductor alloy layer. The precursor gas mixture for the deposition of the p-doped semiconductor alloy layer comprised diborane and silane gases in a ratio of approximately 1 part diborane to 10 parts silane. The intrinsic semiconductor alloy layer was provided with relatively low levels (low ppm) of a precursor diborane dopant by relying upon the residual gaseous boron species absorbed by the walls of the deposition chamber during the previous deposition of the p-doped semiconductor alloy layer.

Sample 2 was fabricated by a process generally similar to the process for fabricating Sample 1 except that boron trifluoride was utilized as a gaseous boron precursor dopant for both the p-doped and the substantially intrinsic semiconductor alloy layer. The ratio of silane to $BF_3$ employed in depositing the p-doped semiconductor alloy layer was approximately 10 to one. As was the case for Sample 1, $BF_3$ doping of the intrinsic semiconductor alloy layer in Sample 2 was accomplished by relying upon the residual boron species adsorbed by the walls of the deposition chamber, which species are outgassed therefrom during the deposition of said intrinsic layer.

Sample 3 was fabricated by a process which included a $BF_3$ p-doped semiconductor alloy layer and an substantially intrinsic semiconductor alloy layer devoid of boron and boron species. The deposition parameters for the $BF_3$ p-doped semiconductor alloy layer were generally similar to the deposition parameters of that layer for the Sample 2 photovoltaic cell insofar as the ratio of silane to $BF_3$ in the precursor gaseous atmosphere was also about 10 to 1. In this Sample however, the residual $BF_3$ ($BF_3$ absorbed by the walls of the deposition chamber during the deposition of the p-doped semiconductor alloy layer) was removed from the chamber by a thorough cleansing of same prior to initiating the deposition of the intrinsic semiconductor alloy layer.

The electrical characteristics of the photovoltaic cells, so prepared, were measured, and the cells were then exposed to Am-1 simulated solar radiation, that is to say solar radiation having an energy density of approximately 1000 watts/m$^2$ and a spectral distribution equivalent to that of solar radiation which is passed through one atmosphere of air. The photovoltaic characteristics of the three cells were periodically measured, the accumulated data tabulated in the graph of FIG. 4.

Figure 4:
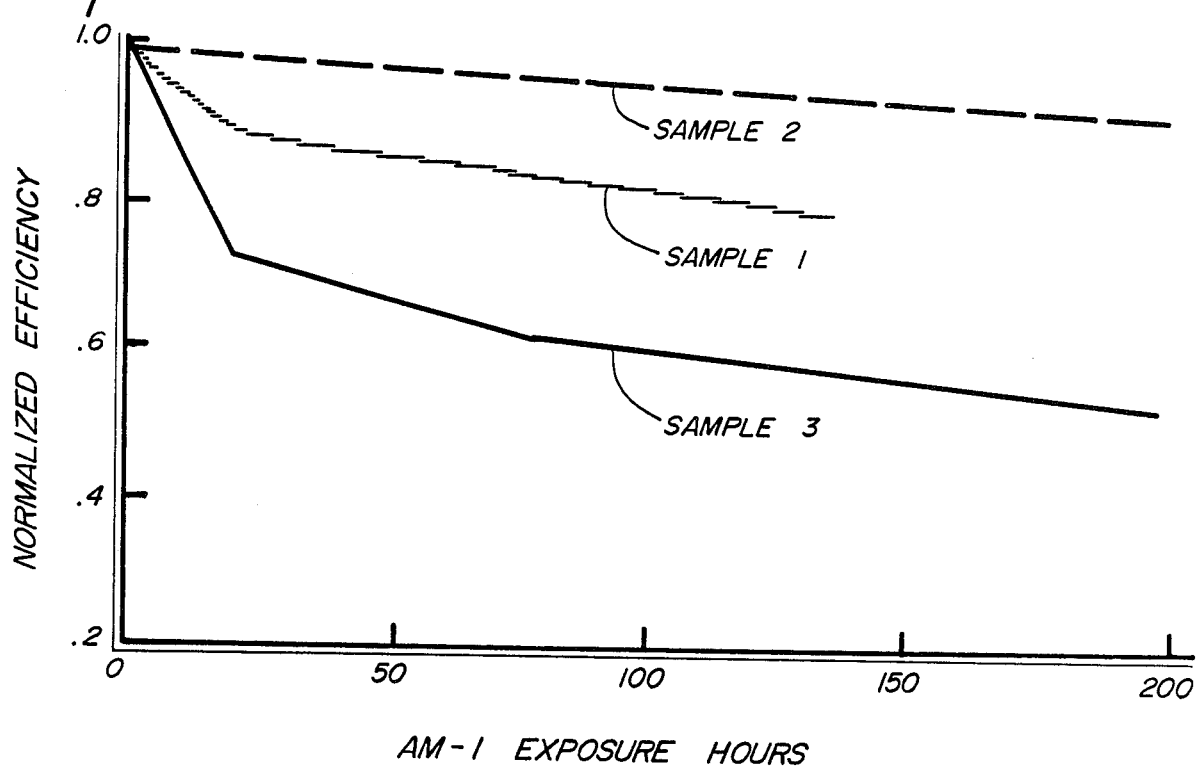
FIG. 4 is a graphic representation of normalized photovoltaic cell efficiency on the ordinate versus time on the abscissa, said representation illustrating the increased performance of cells utilizing the materials and processes of the instant invention.

Normalized efficiencies of the three photovoltaic cells (Samples 1-3) are depicted along the x-axis of the graph of FIG. 4. Normalization was accomplished by measuring the initial efficiency of each of the cells and assigning this efficiency a value of 1.0; subsequent efficiency values for each cell are quantified as being a fraction of the initial efficiency. Depicted along the y-axis of the graph is length of exposure of the cells to AM-1 illumination, in hours. It will be readily apparent from an inspection of the data presented in FIG. 4 that Sample 2, which was fabricated utilizing $BF_3$ to form the p-doped and intrinsic semiconductor alloy layers exhibited the lowest degree of photodegradation, retaining over 90% of its initial operating efficiency after 200 hours of degradation. The normalized efficiencies of both Sample 1 and Sample 3, after degradation, are much lower. Sample 1, in which diborane was employed as the gaseous precursor source of boron, retained approximately 80% of its efficiency after 125 hours photodegradation, while Sample 3, which contained no boron in the intrinsic semiconductor alloy layer exhibited less than 60% of its initial efficiency after the same 125 hours. After 200 hours of photodegradation, Sample 3 lost approximately 50% of its initial operational efficiency.

Accordingly, and as should be apparent from the foregoing data, by utilizing the monoatomic boron species and fabrication principles of the instant invention, photovoltaic cells exhibiting greatly increased resistance to photodegradation may be readily manufactured.

IV. Passivated Semiconductor Layer Surfaces

It has been found that the use of boron halides and pseudo-halides in the fabrication of semiconductor alloy layers in accordance with the principles of the instant invention, eliminates a problem that has theretofore imposed constraints upon the deposition systems and methods employed in fabricating thin film semiconductor devices. In the fabrication of semiconductor devices such as p-i-n type photovoltaic devices, it has heretofore been found that an exposed surface of the semiconductor alloy layers, especially the p-doped semiconductor layer, cannot be subjected to the ambient atmosphere prior to the deposition of succeeding semiconductor layers thereupon. If the vacuum present in the deposition system is broken during the deposition process, the exposed surface of the semiconductor layer contacted by the ambient atmosphere, degrades, said degradation tending to introduce surface states detrimental to the formation of a good interface between that layer and the succeeding semiconductor layer. This degradation is believed to be due to the presence of weak surface bonds which are easily broken by elements and compounds normally present in non-vacuum environments. Said elements and compounds may replace such surface bonds as the relatively weak hydrogen bonds, or said elements and compounds may bind with the many dangling-type bonds which exist due to the presence of chains of boron polymers and oligomers formed during the glow discharge decomposition of diborane and silane precursor gas mixtures.

Because of this problem of surface degradation (a term used hereinafter to refer to the bonding of undesirable atomspheric elements and compounds to the exposed surface of a semiconductor alloy layer), great care had to be taken to avoid atmospheric contact of deposited semiconductor alloy layers during the fabrication of photovoltaic devices lest proper operation of that photovoltaic device be impaired or completely inhibited. For this reason, the semiconductor layers were successively deposited in a single vacuum envelope, as previously described with respect to FIG. 2. In a single deposition chamber (i.e. a batch process) system this constraint mandated that the deposition chamber be completely purged and flushed with an inert gas (without breaking vacuum) between the deposition of each of the successive semiconductor layers. Such a requirement of maintaining the vacuum condition while flushing, entailed an expenditure of time and money, thus serving to further reduce the practiality of employing a batch process for the high volume production of semiconductor devices. In a continuous depostion process employing a multichamber system of dedicated deposition chambers, as in FIG. 2, the constraint of maintaining vacuum between the deposition of succeeding semiconductor layers mandated the use of sophisticated gas gates to (1) isolate the deposition atmospheres between adjacent chambers, (2) provide for the passage of the web of substrate material between said adjacent chambers and (3) maintain the vacuumized state between said adjacent chambers. Furthermore, the problem of formation of surface states on exposed layers of semiconductor material prevented the fabrication and storage of partially completed rolls of semiconductor material for the subsequent deposition of additional semiconductor layers and/or the subsequent configuration of single or multiple layers of semiconductor material into various devices.

$BF_3$ has solved the problem of surface degradation by forming stronger surface bonds and tying up dangling-type surface bonds. And since the problem of surface degradation has been alleviated through the use of monoatomic boron halogen and boron pseudo-halogen compounds in accordance with the principles espoused by the instant invention, the deposition processes and equipment have been correspondingly simplified.

Figure 5:
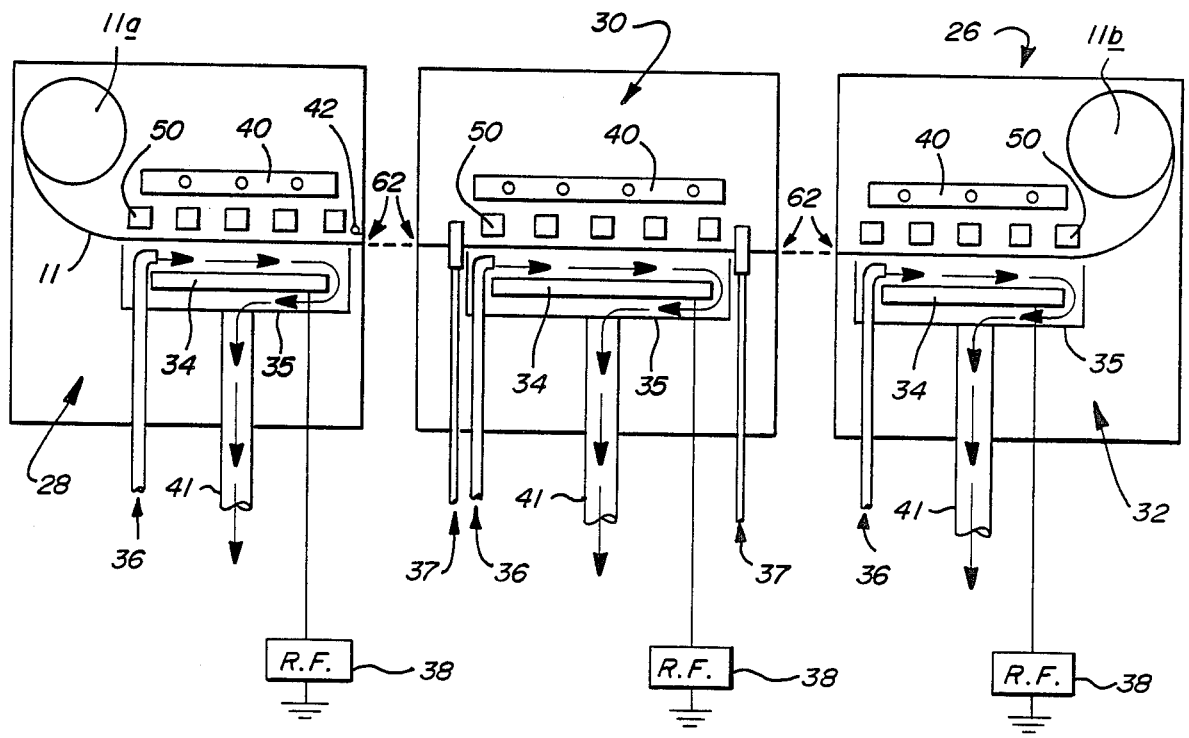
FIG. 5 is a diagrammatic representation of a multiple chamber glow discharge deposition system, similar to the system of FIG. 2, illustrating that a vacuum envelope need not be maintained for the entire path of travel of the web of substrate materials in those instances in which the materials and processes of the instant invention are utilized.

Referring now to FIG. 5, a schematic representation of a multichamber glow discharge apparatus is indicated by the reference numeral 60. The apparatus 60, bears some structural similarities to the glow discharge deposition apparatus 26 depicted in FIG. 2 so that elements similar in structure and function will be referred to by similar reference numerals. The apparatus 60 includes three deposition chambers 28, 30, and 32 generally similar to the p, i, and n deposition chambers of FIG. 2, it being understood that additional individual or pluralities of deposition chambers could be employed with equal advantage. As in the apparatus depicted in FIG. 2, a web of substrate material 11 is continuously fed through the chambers 28, 30 and 32 for the successive deposition of semiconductor layers thereupon. However, where the apparatus 60 of FIG. 4 differs significantly from the apparatus 26 of FIG. 2 in the absence of gas gates (42 in FIG. 2) interconnecting the deposition chambers 28, 30 and 32.

Because the semiconductor coated web of substrate material 11 is not degraded by exposure to ambient atmospheric conditions, the deposition system 60 need not be confined within a single vacuum envelope. That is to say, each deposition chamber 28, 30 and 32 need only form its own vacuum envelope and the web of substrate 11 may be conveyed through each of the individual vacuum atmospheres in passing from chamber to chamber. Accordingly, simple vacuum to air seals 62 may be employed to convey the coated web of substrate material 11 into and out of the successive deposition chambers. In this manner, the instant invention greatly simplifies the apparatus necessary for the continuous production of multiple semiconductor layer, thin film electronic devices such as photovoltaic cells.

Figure 6:
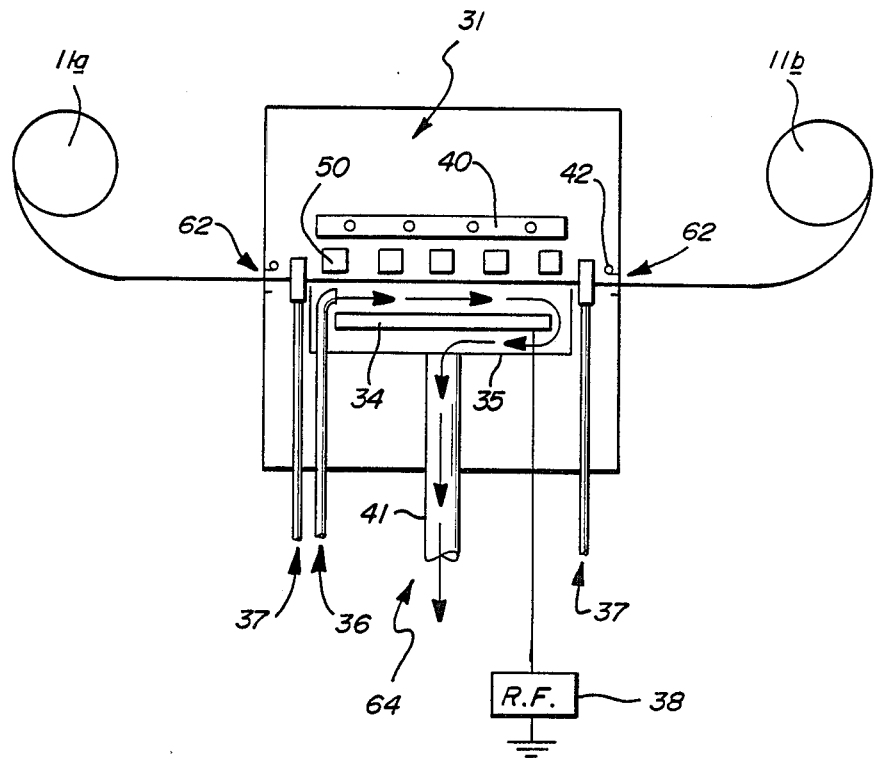
FIG. 6 is a diagrammatic representation of a single chamber glow discharge deposition apparatus, which single chamber can be utilized to successively deposit the p, i, and n layers of semiconductor alloy material if the principles of the instant invention are followed.

The foregoing feature of the instant invention may similarly be employed with a single chamber deposition system. Referring now to FIG. 6, such a single chamber semiconductor deposition system adapted for a continuous mode of operation is indicated generally by the reference numeral 64. The depiction of the single deposition chamber 31 is schematic and represents a chamber generally similar in form and operation to any of the discrete deposition chambers depicted and described with respect to FIGS. 2 and 5. The deposition chamber 31 includes a process gas inlet 36 and an exhaust port 41 which cooperate to maintain the desired deposition atmosphere therein, and a cathode 34 energized by a source of electromagnetic energy, depicted herein as a radio frequency power supply 38. The Figure also schematically depicts substrate pay-off 11a and take-up 11b reels which cooperate to continuously advance a web of substrate material 11 through the deposition chamber 31 which includes vacuum to atmosphere seals 62, well-known to those skilled in the art and generally similar to those seals 62 depicted with reference to FIG. 5.

The apparatus 64 is adapted to deposit a single semiconductor layer upon the web of substrate material 11 as the web advances through the deposition chamber 31 thereof. A coated web of substrate material 11 is then wound about the take-up reel 11b. Because of its "inertness" to ambient atmosphere conditions, the coated web may then be stored for further processing into semiconductor devices. For example, it may be desirable to prepare a large amount of coated substrate having a given type of semiconductor layer deposited thereupon; subsequently, as the need arises, other semiconductor or metallic layers may be deposited thereupon to manufacture a variety of variously configured semiconductor electronic devices. In this manner, a single deposition chamber, such as chamber 64, may either be used to manufacture a plurality of successively deposited semiconductor layers or it may be used to service a variety of downstream production line deposition machinery.

As mentioned, the apparatus 64 of FIG. 6 may be used to sequentially deposit a plurality of semiconductor layers upon the web of substrate material 11. For example, the p-layer of a p-i-n type photovoltaic cell may be deposited upon the web of substrate material 11 as it advances through the chamber 31, and the coated web 11 may then be stored upon the take-up reel 11b. The chamber 31 is then flushed of the deposition atmosphere employed for the preparation of the first semiconductor layer and provided with a new deposition atmosphere for the deposition of the i-layer of the device. The web of substrate material 11, having the p-layer already deposited thereupon, is then readvanced through the deposition chamber for the deposition of the i-layer. When the entire roll has had an i-layer deposited thereupon, the chamber is again emptied and an atmosphere particularly suited for the deposition of an n-type layer is introduced thereinto, and the web of substrate material has that n-layer deposited thereupon. In this manner, a p-i-n photovoltaic cell may be prepared on an elongated web of substrate material without the necessity of employing a plurality of dedicated deposition chambers which are maintained in a continuous vacuum environment.

Regardless of the mode of deposition or the type of deposition apparatus employed, it is a notable feature of the instant invention that semiconductor layers, which are deposited so as to substantially monoatomically include the boron halogen or boron pseudo-halogen species of the instant invention, may be exposed to ambient atmosphere without the production of deleterious surface effects. It may even be said that the surfaces of semiconductor alloy layers are substantially "passivated" from the harmful effects caused by exposure to ambient conditions.

V. The Electrophotographic Photoreceptor

Figure 7:
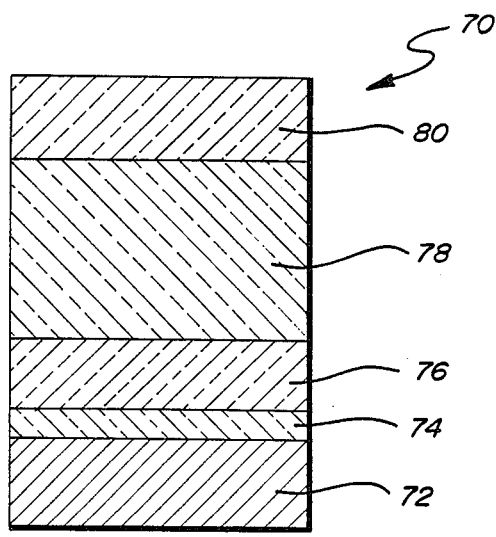
FIG. 7 is a cross-sectional view of an electrophotographic drum fabricated from the materials and in accordance with the principles of the instant invention.

Referring now to FIG. 7, a photoreceptor adapted for use in an electrophotographic process is shown in cross-section by the reference numeral 70. The photoreceptor 70 includes a plurality of layers of semiconductor alloy material deposited upon an electrically conductive substrate member 72 which may be formed of a rigid, durable material such as aluminum or stainless steel. Immediately atop the substrate 72 is an adhesion promoting layer 74 which functions to provide a tight bond between the substrate 72 and the successively deposited layers. The adhesion promoting layer 74 is preferably formed from a material such as silicon nitride, silicon oxide or silicon carbide and is typically about 1000 angstroms thick. Atop the adhesion promoting layer 74 is a blocking layer 76, typically formed of a doped semiconductor alloy material having a conductivity type optimized to prevent the injection of charge carriers from the substrate 72 into the successively deposited layers of the photoreceptor 70. In the preferred embodiment, the blocking layer 76 is formed from a silicon:hydrogen:fluorine alloy doped with a sufficient amount of boron to make it a p− type conductivity layer (referred to herein as a "lightly" p-doped layer).

Disposed immediately atop the blocking layer is the photoconductive member 78 of the photoreceptor 70. It is this photoconductive member 78 which is adapted to (1) accumulate and hold a static electric charge in the dark and (2) conduct away that charge when and where illuminated. In the illustrated embodiment, the photoconductive member 78 is preferably approximately 25 microns thick and is formed from an alloy of silicon:hydrogen:fluorine which monoatomically incorporates therein the boron halogen or boron pseudo-halogen species of the instant invention. Immediately atop the photoconductive member 78, an insulating layer 80 may be advantageously disposed. This insulating layer, which is approximately 6000 angstroms or less in thickness and may be formed from an insulating material such as silicon carbide or organic materials, protects the photoconductive member 78 therebelow from mechanical damage and aids in charge retention by preventing ambient atmospheric ions from discharging the static charge on the photoconductive member 78.

It will be noted that the electrophotographic photoreceptor 70 of FIG. 7 is a relatively thick device, especially in comparison to other semiconductor devices such as the photovoltaic cells described hereinabove; accordingly, problems of internal stress and bulk strain are quite significant. In other words, stress manifested in thin film layers of semiconductor material is exacerbated when depositing the much thicker layers necessary for photoreceptors. As mentioned previously, it is difficult to actually quantify the amount of bulk stress and strain in a sample of semiconductor material, however the presence of stress and strain may be inferred from the formation of haze in the layer and a decrease in the charge storing capacity (Vsat) of that layer. It has been found that strain developed in the various semiconductor layers of a photoreceptor can in some cases cause those layers to crack, which cracks decrease the charge holding capability of the photoreceptors in which they occur (presumably because the cracks provide paths for the discharge of current). In other cases, no cracking is apparent however charge holding capacity is still decreased, presumably because of the presence of micro cracks or because of charge carrying paths provided by the boundaries of highly stressed regions. Furthermore, it has been found that cracks may nucleate the growth of undesirable morphologies thereupon, which morphologies may continue to grow throughout the entire thickness of the photoreceptor.

It is a notable feature of the instant invention that the incorporation of boron halides or pseudo-halides into the various semiconductor alloy layers of an electrophotographic photoreceptor results in a notable and substantial decrease in the bulk stress thereof, which decrease in bulk stress translates to decreased growth of undesirable morphologies and increased charge storage capability. It has also been found that the tendency of the boron species to be monoatomically incorporated into the semiconductor host matrix further reduces undesirable growth morphologies. This is presumably because such morphologies are also nucleated by oligomeric and polymeric boron species present in prior art diborane doped semiconductor layers.

In accordance with another feature of the instant invention, the photoconductive member 78 of the photoreceptor 70 may be formed so as to include a plurality of superposed layers of varying composition. This laminar structure of the photoconductive member provides further stress relief and thereby further eliminates the associated problems of peeling, cracking and strain related problems resulting in lower saturation voltage. In one preferred embodiment, the photoconductive member 78 is a 25 micron thick layer including therein two superposed 12.5 micron thick layers which differ slightly only in the total amount of fluorine incorporated in each. Depending upon the total thickness of the semiconductor layer to be deposited, structures comprised of a still greater number of laminated layers can also be advantageously employed to provide further stress relief.

While the semiconductor layers from which the electrophotographic photoreceptor 70 of FIG. 7 are fabricated may be prepared via a variety of well known thin film semiconductor deposition techniques such as sputtering, evaporation, or radio frequency energized glow discharge deposition, it has been found that microwave energized glow discharge deposition, because of its comparatively high rate of deposition, is especially advantageous for preparing the relatively thick photoreceptor layers. A more complete discussion of the use and advantages of microwave deposition for fabricating electrophotographic photoreceptors is found in commonly assigned U.S. patent application Ser. No. 580,086 filed Feb. 14, 1984, the disclosure of which is incorporated by reference.

A photoreceptor, generally similar to that depicted with reference to FIG. 7 was prepared as follows in a microwave glow discharge process. A cleaned and polished aluminum substrate was placed in a deposition chamber having a volume of approximately 600 cc. A deposition atmosphere of silane and nitrogen was provided in the deposition chamber which was maintained at a pressure of approximately 20 microns. The substrate was heated to 250° C., microwave energy of 120 watts having a frequency of 2.54 GHz was initiated and the deposition of the silicon nitride layer began. The silicon nitride was deposited at a rate of approximately 1 angstrom per second so as to form, after 1000 seconds, a 1000 angstrom thick silicon nitride film. A new gaseous atmosphere comprising 30 sccm of silane, 3 sccm of silicon tetrafluoride, and 0.2 sccm of 3.9% boron trifluoride in hydrogen was introduced to flow through the chamber, said chamber maintained at a pressure of about 20 microns. This resulted in a ratio of 260 ppm $BF_3/SiH_4$. The substrate was maintained at a temperature of 250° C. and the deposition proceeded at a rate of 100 angstroms/second for 50 seconds. The deposition was then terminated with the deposition of a layer of lightly p-doped silicon alloy material of approximately 5000 angstroms thickness.

The photoconductive layer was deposited as a dual layer structure as described above. A deposition atmosphere of 30 sccm of silane, 2 sccm of silicon tetrafluoride and 0.02 sccm of 3.9% boron trifluoride in hydrogen was introduced to flow through the chamber which was maintained at 20 microns pressure. This represented a ratio of 26 ppm $BF_3/SiH_4$. The substrate was maintained at a temperature of 225° C., and the deposition occured at a rate of approximately 150 angstroms per second. After approximately 12.5 microns of a silicon alloy layer was deposited, the flow of silicon tetrafluoride was increased to approximately 4 sccm and the deposition continued until approximately an additional 12.5 microns of a silicon alloy layer was deposited.

Following the deposition of the photoconductive layer, a 6000 angstrom thick top protective layer of silicon carbide was deposited by a glow discharge decomposition of an atmosphere of silane and methane.

The electrophotographic photoreceptor thus produced exhibited no visible signs of bulk stress i.e. no cracking or peeling was noted. It was additionally found in use that the photoreceptor could sustain an electrostatic charge of approximately 400 volts while a similarly configuraed photorecepter fabricated from diborane could sustain a voltage of only 200 volts. These superior qualities which are exhibited by the deposited semiconductor alloy material may be termed "synergistic" when it is realized that the material was deposited by a microwave glow discharge process. The term synergistic is used because Applicants have heretofore experienced that microwave processes, vis-a-vis, radio frequency processes, normally deposit highly stressed films. Therefore, it is indeed surprising that it was possible to deposit, by a microwave process, a semiconductor film of 25 microns thickness which not only adhered to the substrate, but exhibited excellent electrical and mechanical properties. Applicants believe that the explanation lies in the use of boron halogens and pseudo-halogens which remain substantially monoatomic even in the energetic environment of a high electron temperature microwave plasma.

While the foregoing example describes the fabrication of an electrophotographic photoreceptor by a microwave activated process, the instant invention is obviously not so limited. It is a therefore noteable feature of the instant invention that superior stress relief in electrophotographic photoreceptors may be achieved the alleviation of stress and strain in the formation of the semiconductor matrix through the use of the monoatomically incorporated boron halogen or boron pseudo-halogen species of the instant invention as well as by the use of a laminar structure for forming one or more of the various layers of the electrophotographic photoreceptor.

The foregoing descriptions, drawings and example are merely illustrative of the principles of the instant invention, and are not intended to be limitations thereon. It is the following claims, including all equivalents, which are intended to define the scope of the invention.

What we claim is:

1. A method of fabricating an improved p-doped semiconductor alloy material which includes at least boron and fluorine incorporated into the semiconductor host matrix thereof; said method including the step of introducing a gaseous precursor mixture for (1) plasma induced decomposition thereof and (2) deposition thereof onto a substrate so as to form the p-doped semiconductor alloy material; the method including the further steps of:

providing $BF_3$ and a silicon containing gas in the precursor mixture;

providing microwave energy of approximately 2.54 GHz to the precursor mixture so as to initiate a glow discharge plasma therefrom for decomposing said precursor mixture; and substantially monoatomically and tetrahedrally incorporating at least approximately 1.9% of boron into the semiconductor alloy as said alloy is being deposited, whereby said alloy is characterized by substantially reduced bulk strain and substantially reduced nucleation of undesirable morphology and growth of the semiconductor alloy material.

2. A method as in claim 1, including the further step of providing a gaseous precursor mixture including a germanium containing species therein.

* * * * *